(12) United States Patent
Um et al.

(10) Patent No.: US 9,812,293 B2
(45) Date of Patent: Nov. 7, 2017

(54) DIELECTRIC WINDOW, PLASMA PROCESSING SYSTEM INCLUDING THE WINDOW, AND METHOD OF FABRICATING SEMICONDUCTOR DEVICE USING THE SYSTEM

(71) Applicant: Samsung Electronics Co., Ltd., Suwon-si, Gyeonggi-do (KR)

(72) Inventors: Jung-hwan Um, Seongnam-si (KR); Sung-moon Park, Suwon-si (KR); Dong-wook Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/179,389

(22) Filed: Jun. 10, 2016

(65) Prior Publication Data
US 2017/0084427 A1    Mar. 23, 2017

(30) Foreign Application Priority Data
Sep. 23, 2015    (KR) .................. 10-2015-0134815

(51) Int. Cl.
    *H01J 37/32*    (2006.01)
(52) U.S. Cl.
    CPC ....... *H01J 37/32119* (2013.01); *H01J 37/321* (2013.01); *H01J 37/3211* (2013.01); *H01J 37/3266* (2013.01)
(58) Field of Classification Search
    CPC . H01J 37/3249; H01J 37/3211; H01J 37/3266
    USPC .................................... 315/111.51
    See application file for complete search history.

(56) References Cited

U.S. PATENT DOCUMENTS

| 6,308,654 | B1* | 10/2001 | Schneider | H01J 37/321 118/723 I |
| 6,694,915 | B1* | 2/2004 | Holland | H01J 37/321 118/715 |
| 6,953,908 | B2* | 10/2005 | Ishii | H01J 37/32192 219/121.43 |
| 7,930,992 | B2 | 4/2011 | Nozawa et al. | |
| 8,955,456 | B2 | 2/2015 | Cullen et al. | |

(Continued)

FOREIGN PATENT DOCUMENTS

| KR | 10-0695597 B1 | 3/2007 |
| KR | 2007-0066365 A | 6/2007 |

(Continued)

*Primary Examiner* — Dylan White
(74) *Attorney, Agent, or Firm* — Harness, Dickey & Pierce, P.L.C.

(57) ABSTRACT

A plasma process apparatus including a process chamber defined by an outer wall and a dielectric window, the dielectric window including a first dielectric material and covering an upper portion of the outer wall, the dielectric window including a top surface facing outside of the process chamber and a bottom surface facing insider of the process chamber, the dielectric window further including at least one magnetic-field control groove at the top surface of the dielectric window, and a coil antenna over the dielectric window and configured to receive RF power, the coil antenna including an inner coil and an outer coil, the inner coil over a center of the dielectric window, the outer coil over an edge of the dielectric window and surrounding the inner coil may be provided.

16 Claims, 20 Drawing Sheets

(56) References Cited

U.S. PATENT DOCUMENTS

| | | | |
|---|---|---|---|
| 8,988,012 B2* | 3/2015 | Yoshikawa | H01J 37/32192 |
| | | | 315/111.21 |
| 9,048,070 B2* | 6/2015 | Tian | H01J 37/32238 |
| 2009/0211708 A1* | 8/2009 | Matsumoto | H01J 37/32192 |
| | | | 156/345.41 |
| 2012/0152901 A1* | 6/2012 | Nagorny | H01J 37/321 |
| | | | 216/68 |
| 2013/0008607 A1 | 1/2013 | Matsumoto et al. | |
| 2013/0098554 A1 | 4/2013 | Chhatre et al. | |
| 2013/0292055 A1 | 11/2013 | Setton et al. | |
| 2014/0217895 A1* | 8/2014 | Busche | H01J 37/32522 |
| | | | 315/117 |
| 2014/0230729 A1 | 8/2014 | Brandon et al. | |
| 2014/0262034 A1* | 9/2014 | Ishibashi | C23C 16/45563 |
| | | | 156/345.29 |

FOREIGN PATENT DOCUMENTS

| | | |
|---|---|---|
| KR | 2013-0123337 A | 11/2013 |
| KR | 2014-0090219 A | 7/2014 |

* cited by examiner

FIG. 10A
FIG. 10B
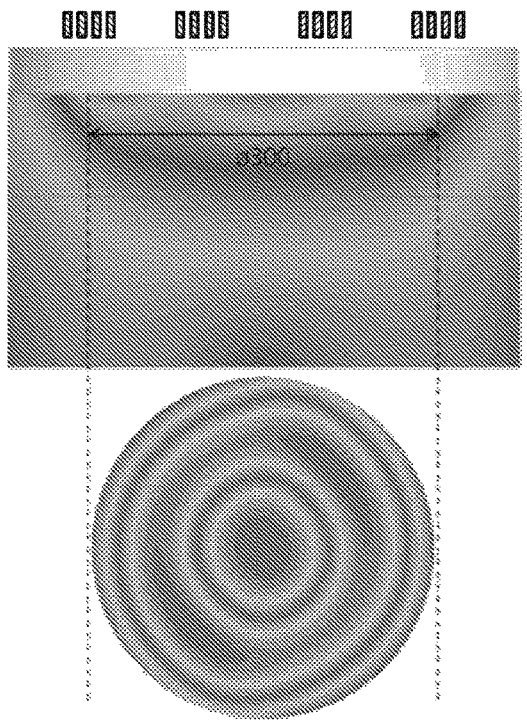
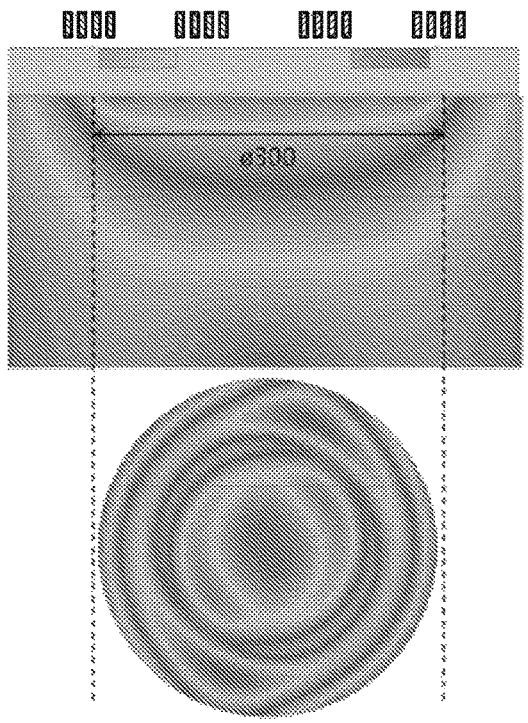

DIELECTRIC WINDOW, PLASMA PROCESSING SYSTEM INCLUDING THE WINDOW, AND METHOD OF FABRICATING SEMICONDUCTOR DEVICE USING THE SYSTEM

CROSS-REFERENCE TO RELATED APPLICATION

This application claims the benefit of Korean Patent Application No. 10-2015-0134815, filed on Sep. 23, 2015, in the Korean Intellectual Property Office, the disclosure of which is incorporated herein in its entirety by reference.

BACKGROUND

The inventive concepts relate to apparatuses and methods for fabricating a semiconductor device, and more particularly, to plasma process systems for performing a plasma process and/or methods of manufacturing a semiconductor device by using the system.

Plasma is being widely used in processes of fabricating semiconductor devices, plasma display panels (PDPs), liquid crystal displays (LCDs), and solar cells. Typical plasma processes may include a dry etching process, a plasma-enhanced chemical vapor deposition (PECVD) process, a sputtering process, and an ashing process. In general, capacitively coupled plasma (CCP), inductively coupled plasma (ICP), helicon plasma, or microwave plasma may be used in the plasma processes. A plasma process may be closely related to plasma parameters, for example, an electron density, an electron temperature, an ion linear velocity, and ion energy. In particular, it is known that plasma density and plasma uniformity are closely related to throughput. Thus, plasma sources having higher densities and/or more uniform distribution are actively researched.

SUMMARY

The inventive concepts provide dielectric windows capable of uniformizing density distribution of plasma in a plasma process, plasma process systems including the window, and methods of manufacturing a semiconductor device by using the system.

According to an aspect of the inventive concepts, a dielectric window includes a first dielectric material and further includes a first surface facing an inside of a plasma chamber and a second surface opposite to the first surface and facing an outside of the plasma chamber, the dielectric window defining a magnetic-field control groove in the second surface thereof.

According to another aspect of the inventive concepts, a plasma process system includes a chamber including an outer wall and a dielectric window, the outer wall defining a reaction space in which plasma is generated, the dielectric window covering an upper portion of the outer wall and including a first dielectric material, the dielectric window defining a magnetic-field control groove in an outer surface of the dielectric window, the outer surface being a surface opposite to an inner surface facing the reaction space, a coil antenna over the outer surface of the dielectric window, the coil antenna including an inner coil and an outer coil, and a radio-frequency (RF) power device configured to supply RF power to the coil antenna.

According to another aspect of the inventive concepts, a method of fabricating a semiconductor device includes providing a wafer in a chamber, the chamber including an outer wall and a dielectric window, the outer wall defining a reaction space in which plasma is generated, the first dielectric window covering an upper portion of the outer wall and including a first dielectric material, the first dielectric window defining a magnetic-field control groove on an outer surface thereof, the outer surface being a surface opposite to an inner surface facing an inside of the chamber, generating the plasma by injecting a process gas into the chamber and applying RF power, analyzing the plasma in the chamber, and controlling uniformity of the plasma with respect to a threshold uniformity variation. The controlling uniformity of the plasma may be performed by using the first dielectric window.

According to another aspect of the inventive concepts, a plasma process apparatus includes a process chamber defined by an outer wall and a dielectric window, the dielectric window including a first dielectric material and covering an upper portion of the outer wall, the dielectric window including a top surface facing outside the process chamber and a bottom surface facing inside the process chamber, the dielectric window further including at least one magnetic-field control groove at the top surface of the dielectric window, a coil antenna over the dielectric window and configured to receive RF power, the coil antenna including an inner coil and an outer coil, the inner coil over a center of the dielectric window, the outer coil over an edge of the dielectric window and surrounding the inner coil, and

BRIEF DESCRIPTION OF THE DRAWINGS

Example embodiments of the inventive concepts will be more clearly understood from the following detailed description taken in conjunction with the accompanying drawings in which:

FIGS. 10A and 10B show a stimulation image of magnetic field magnitudes in a chamber adopting a dielectric window, which is free from a magnetic-field control groove, and a stimulation image of magnetic field magnitudes in a chamber adopting a dielectric window including a magnetic-field control groove according to an example embodiment, respectively;

DETAILED DESCRIPTION

Figure 1A:
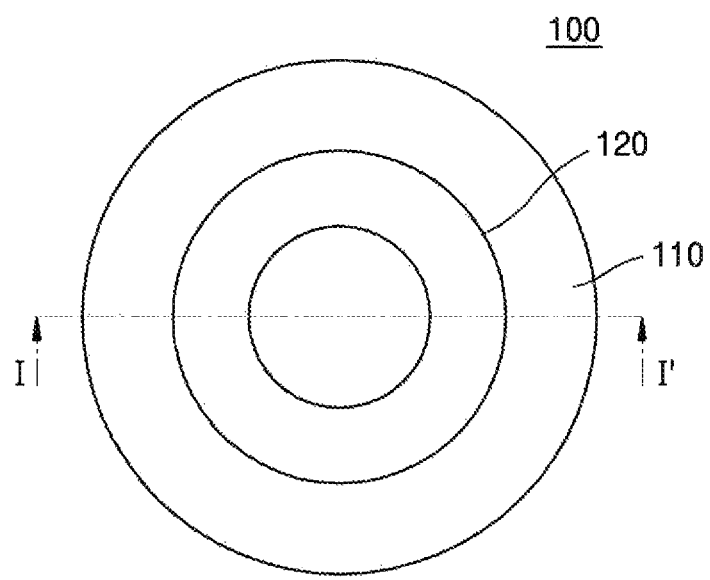
FIGS. 1A and 1B are a plan view and a cross-sectional view of a dielectric window, respectively, according to an example embodiment.

As used herein, the term "and/or" includes any and all combinations of one or more of the associated listed items. Expressions such as "at least one of," when preceding a list of elements, modify the entire list of elements and do not modify the individual elements of the list.

The inventive concepts will now be described more fully hereinafter with reference to the accompanying drawings, in which various example embodiments of the inventive concepts are shown. This inventive concepts may, however, be embodied in different forms and should not be construed as limited to the example embodiments set forth herein. Rather, these example embodiments are provided so that this disclosure is thorough and complete and fully conveys the scope of the inventive concepts to one skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. In the drawings, the thicknesses of layers and regions may be exaggerated for clarity. Descriptions of components and processing techniques that are irrelevant to the example embodiments of the inventive concepts are omitted for brevity. Like reference numerals refer to like elements throughout. The terminology used herein to describe example embodiments of the inventive concepts is not intended to limit the scope of the inventive concepts.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of example embodiments.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, some example embodiments will be explained in further detail with reference to the accompanying drawings.

Figure 1B:
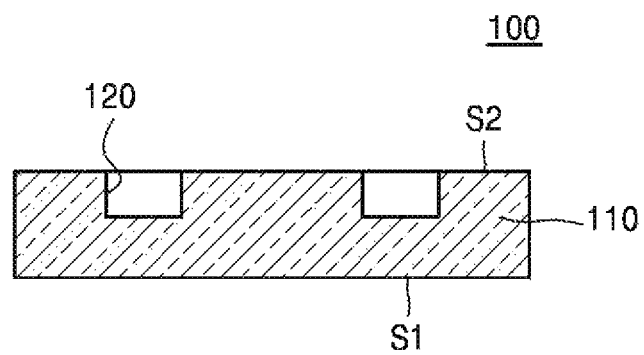

FIGS. 1A and 1B are a plan view and a cross-sectional view of a dielectric window 100 according to an example embodiment, respectively. FIG. 1B is a cross-sectional view taken along a line I-I' of FIG. 1A.

Figure 18:
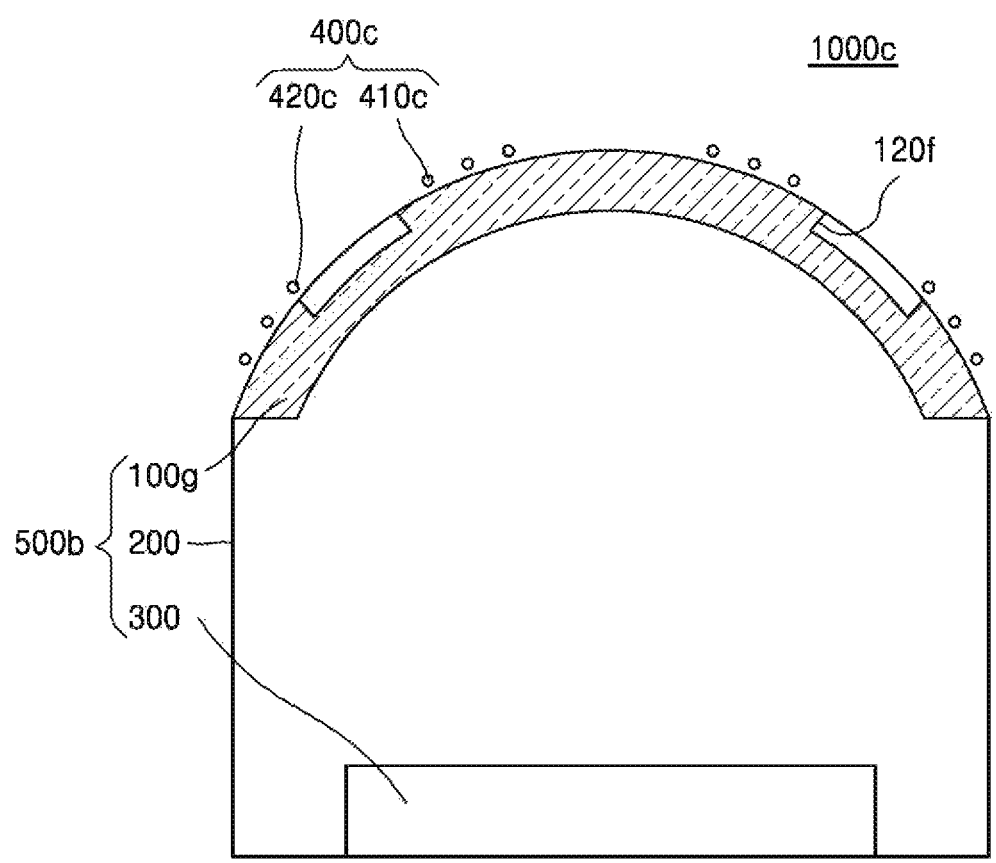

Referring to FIGS. 1A and 1B, the dielectric window 100 according to the present example embodiment may have a circular plate structure and includes a body 110 and a magnetic-field control groove 120. A structure of the dielectric window 100 is not limited to the circular plate structure. The dielectric window 100 may have one of various structures according to a structure of a chamber (refer to 500 in FIG. 14) adopting the dielectric window 100. For example, the dielectric window 100g may have a dome structure as shown in FIG. 18.

The body 110 may form the entire outer appearance of the dielectric window 100 and be substantially the same as the dielectric window 100. However, the dielectric window 100 may be interpreted as including the magnetic-field control groove 120, while the body 110 may refer to only a portion of the dielectric window 100 except the magnetic-field control groove 120.

As can be seen from the name of the dielectric window 100, the body 110 may include a dielectric material. The body 110 may include a material having a relatively low dielectric constant. For example, the body 110 may be fabricated by using alumina (Al2O3), quartz, silicon carbide (SiC), silicon oxide (SiO2), TEFLON, G10 epoxy, or one of other dielectric materials, non-conductor materials, or semiconductor materials. In the dielectric window 100 according to the present example embodiments, the body 110 may be fabricated by using alumina or quartz. When the body 110 is fabricated by using alumina, the body 110 may have a thickness of about 20 mm. When the body 110 is fabricated by using quartz, the body 110 may have a thickness of about 30 mm. Also, the body 110 may have a diameter of about 400 mm to about 500 mm. A material, thickness, and diameter of the body 110 included in the dielectric window 100 are not limited to the above-described materials, thickness, and diameter. For example, a material or size of the body 110 may vary depending on a function or structure of the chamber adopting the dielectric window 100.

Because the body 110 forms an outer appearance of the dielectric window 100, the body 110 may have a circular plate structure. a structure of the body 110 may vary depending on a structure of the dielectric window 100. For example, the body 110 may have an elliptical plate structure or a polygonal plate structure instead of the circular plate structure. For example, the body 110 may have a dome structure that is convex upward. When the body 110 has the dome structure, a horizontal section of the body 110 may have, for example, a circular ring structure, an elliptical ring structure, or a polygonal ring structure.

Figure 17:
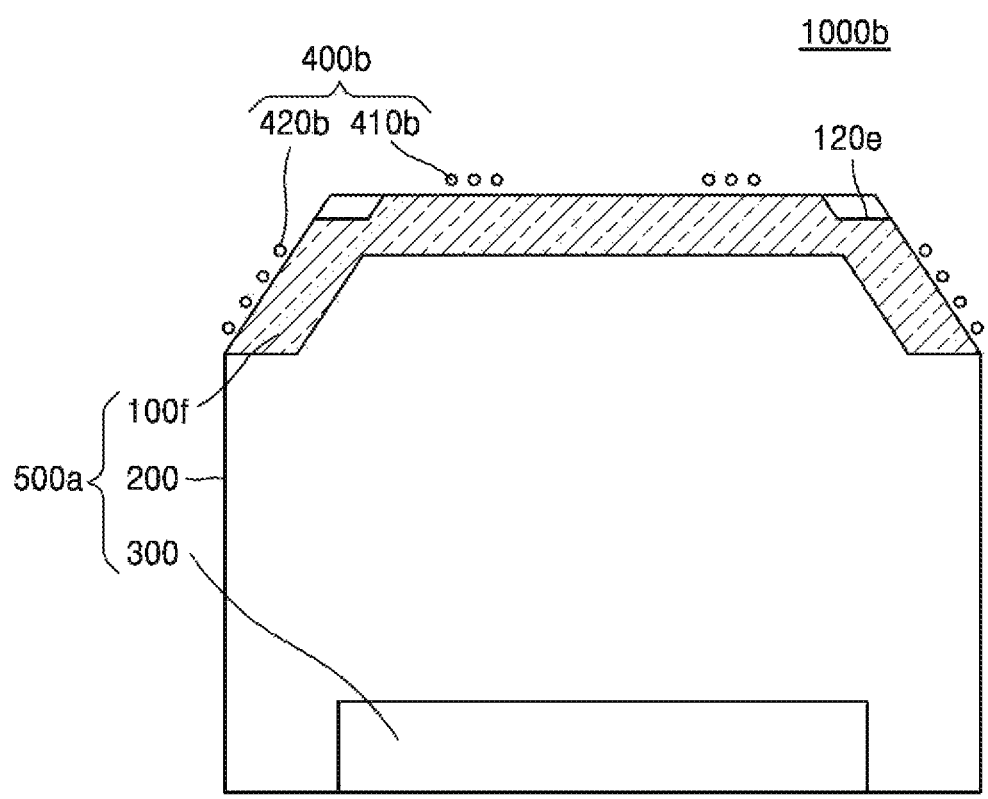

The body 110 may have a truncated conic structure having inclined flat side surfaces and a flat top surface like a body included in a chamber 500a of FIG. 17. The body 110 may have a typical dome structure in which the entire side surfaces and top surface are curved shaped, like a body included in a chamber 500b of FIG. 18.

Although not shown, a through hole may be formed in the center of the body 110. When the dielectric window 100 is combined with an outer wall of the chamber and forms the chamber, a process gas supply head may be combined with the through hole. The process gas supply head may penetrate the through hole and be combined with the body 110. A plurality of fine spray holes (now shown) may be formed in a bottom surface and side surfaces of the process gas supply head so that process gases may be sprayed into the chamber through the fine spray holes.

The magnetic-field control groove 120 may be formed as a circular ring type in a top surface S2 of the body 110. When the dielectric window 100 is combined with an outer wall of the chamber and forms the chamber 500 (see FIG. 14), a bottom surface 51 of the body 110 may face the inside of the chamber 500, while the top surface S2 of the body 110 may be exposed outside the chamber 500. Accordingly, the magnetic-field control groove 120 may not be affected by plasma generated in the chamber 500. Also, the magnetic-field control groove 120 may not affect the flow of plasma in chamber 500.

As shown in FIG. 1B, a cross-section of the magnetic-field control groove 120 may have a rectangular structure. However, the cross-section of the magnetic-field control groove 120 is not limited to the rectangular structure. A sectional structure of the magnetic-field control groove 120, according to various example embodiments, will be described later in further detail with reference to FIG. 13.

A position, size (or width), and depth of the magnetic-field control groove 120 may be appropriately adjusted to improve uniformity of plasma in the chamber. An improvement in the uniformity of plasma may correspond to optimization of a distribution of magnetic fields generated under the dielectric window 100 due to a coil antenna (400 in FIG. 4). For example, the coil antenna may include an inner coil (410 in FIG. 4) and an outer coil (420 in FIG. 4). A magnetic field generated by the inner coil may interfere with a magnetic field generated by the outer coil so that magnetic field magnitude may weaken in a middle portion between the inner coil and the outer coil. A plasma density may be low in the portion having a weak magnetic field magnitude.

Accordingly, the magnetic-field control groove 120 may be formed in a portion of the body 110 corresponding to the portion having the weak magnetic field magnitude, and magnetic field magnitude under the magnetic-field control groove 120 may increase due to the magnetic-field control groove 120. A rise in magnetic field magnitude due to the magnetic-field control groove 120 may lead to an increase in plasma density of a portion of the chamber corresponding to the magnetic-field control groove 120, thereby contributing toward improving the uniformity of plasma in the chamber. The optimization of a distribution of magnetic field depending on a position, size (or width), and depth of the magnetic-field control groove 120 will be described later in further detail with reference to FIGS. 4 to 9.

In the dielectric window 100 according to the present example embodiment, the magnetic-field control groove 120 may be formed in the top surface S2 of the body 110 so that a distribution of magnetic field in the chamber may be optimized in a plasma process so as to improve plasma uniformity. Therefore, due to the improve plasma uniformity, the dielectric window 100 according to the present example embodiment may contribute toward performing a stable plasma process and fabricating more reliable semiconductor devices.

Figure 2:
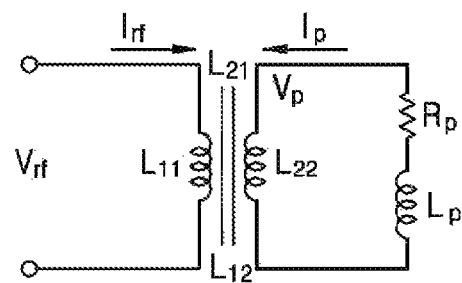
FIG. 2 is a circuit diagram for explaining a principle of transmission of power to plasma due to a transformer model.

FIG. 2 is a circuit diagram for explaining a principle of transmission of power to plasma due to a transformer model.

Referring to FIG. 2, a magnetic field may be generated by a coil structure of a coil antenna and the generated magnetic field is one factor influencing uniformity of plasma during a plasma process. The magnetic field may affect the distribution uniformity of the plasma because energy required for generating plasma may be obtained by electrons in an ICP source, and a main energy source may be an induced electric field generated due to a variation of induced magnetic field over time. Here, the induced magnetic field may be generated due to current flowing in the coil antenna. Accordingly, a distribution of densities of plasma in a chamber may depend on a distribution of magnetic fields.

A magnetic field generated in a specific position may be used for transmission of power to plasma according to a transformer model as in the following equations:

$$Vrf = i\omega L11 Irf + i\omega L12 Ip + Rloss Irf \quad (1),$$

$$Vp = i\omega L21 Irf + i\omega L22 Ip \quad (2),$$

$$Vp = -Ip(Rp + i\omega Lp) \quad (3),$$

$$Zs = Vrf/Irf = i\omega L11 + \omega^2 L12 L21/(Rp + i\omega(L22 + Lp)) + Rloss \quad (4), \text{ and}$$

$$Pabs = \tfrac{1}{2}|Irf|^2 Re(Zs) = \tfrac{1}{2}|Irf|^2 [Rloss + \omega^2 L12 L21 Rp/(Rp^2 + \omega^2(L22 + Lp)^2)] \quad (5),$$

wherein Rp denotes a plasma resistance, Lp denotes an inductance of plasma, Rloss denotes a resistance of the coil antenna, L12 and L21 denote mutual inductances between the coil antenna and plasma, L11 denotes a self-inductance of the coil antenna, and L22 denotes a self-inductance due to current flowing in plasma. Meanwhile, the plasma resistance Rp may be indicated by veffLp, and veff may denote an effective collision frequency.

Figure 14:
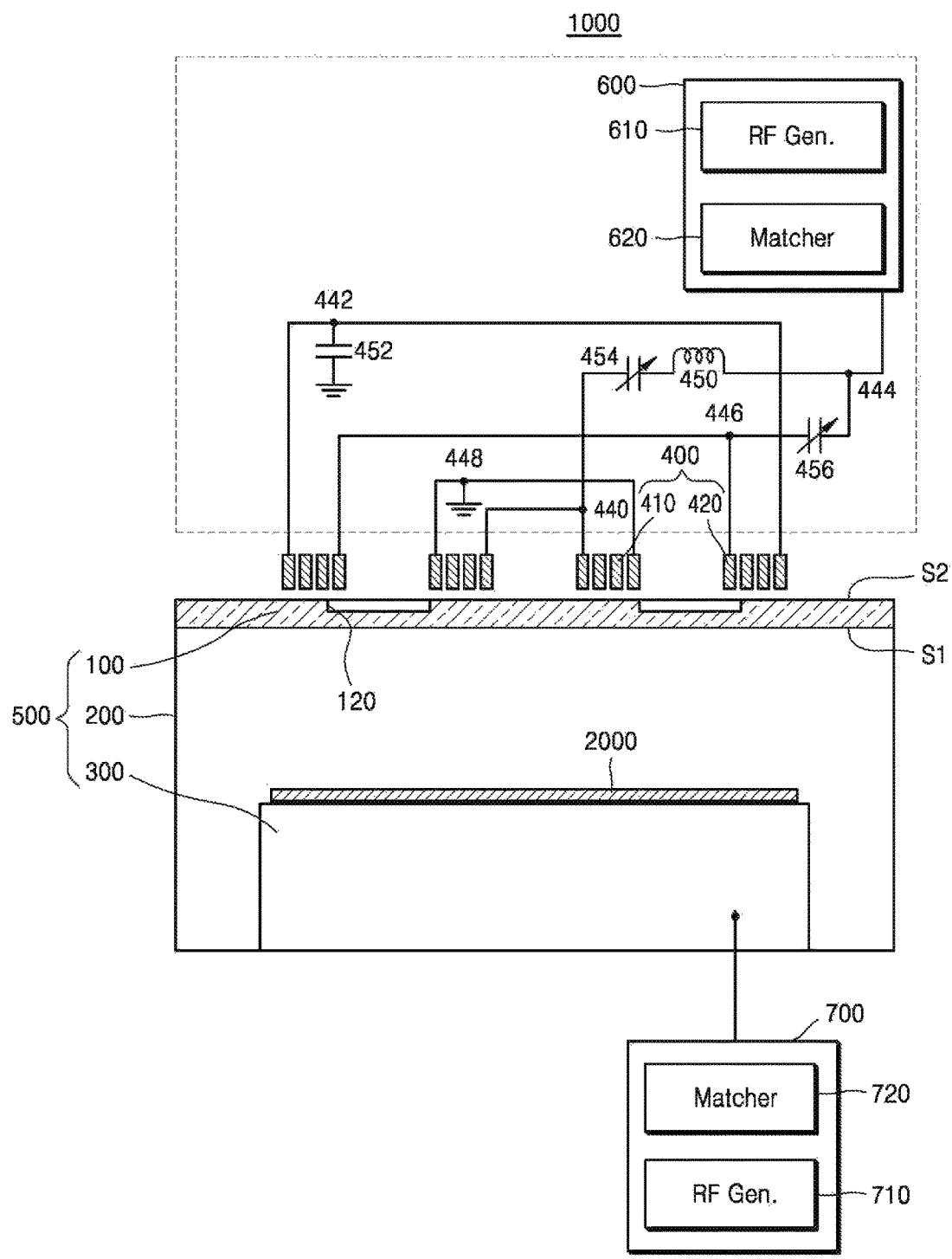
FIG. 14 is a schematic construction diagram of a plasma process system including a dielectric window according to an example embodiment.

In Equation (5), Pabs denotes power supplied by an RF power device (600 in FIG. 14). Equation (5) will now be briefly described. Supplied power may be largely divided into a power element (i.e., ½|Irf|²Rloss) consumed by an antenna resistor and a power element (i.e., ½|Irf|²ω²L12L21Rp/(Rp²+ω²(L22+Lp)²)) that is transmitted to plasma and consumed. Furthermore, among factors related to the transmission of power to plasma, the mutual inductances L21 and L12 between the coil antenna and plasma may direct affect the transmission of power to plasma. Therefore, a section having a distorted magnetic field may be detected, and a shape of a dielectric window related to magnetic permeability may be modified so that the uniformity of magnetic fields in the chamber may be improved. For instance, a portion having a weak magnetic field magnitude may be detected, and a thickness of a portion of the dielectric window corresponding to the portion having the weak magnetic field magnitude may be reduced. Thus, a magnetic field magnitude of the portion having the weak magnetic field magnitude may increase so that the uniformity of magnetic fields in the chamber may be improved. An analysis process for obtaining a uniform distribution of magnetic fields in the chamber by detecting a section having a distorted magnetic field and modifying a shape of the dielectric window, and a method of optimizing the shape of the dielectric window by using the analysis process will be described in detail later with reference to FIGS. 4 to 9.

Figure 3:
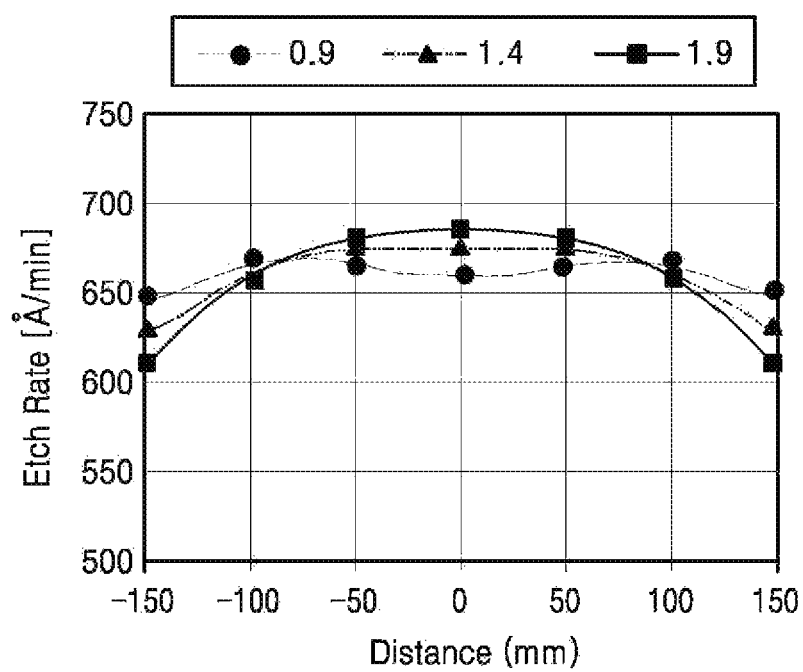
FIG. 3 is a graph for explaining a dead zone in a chamber.

FIG. 3 shows curves for explaining a dead zone in a chamber. In FIG. 3, an abscissa denotes a distance (mm) from a center of a 300-mm wafer, and an ordinate denotes an etch rate (Å/min). Meanwhile, Iin/Iout may refer to a ratio of current Iin applied to an inner coil to current Iout applied to an outer coil in a coil antenna (400 in FIG. 15B) including the inner coil (410 in FIG. 15B) and the outer coil (420 in FIG. 15B). In FIG. 3, a circular dot has a ratio Iin/Iout of 0.9, a triangular dot has a ratio Iin/Iout of 1.4, and a square dot has a ratio Iin/Iout of 1.9.

Referring to FIG. 3, when the ratio Iin/Iout has a low value (e.g., when the current Iout applied to the outer coil is relatively large as illustrated by a circular dot curve), an etch rate may be relatively low in the center and an outer portion of a wafer and the curve may show an M shape. By comparison, when the ratio Iin/Iout has a relatively high value (e.g., when the current Iin applied to the inner coil is relatively large as illustrated by a square dot curve), an etch rate may be highest in the center of the wafer and gradually reduced toward an outer portion of the wafer so that the curve may be parabolic-shaped.

As the ratio Iin/Iout increases, an etch rate may increase in the center of a wafer but decrease in an outer portion of the wafer. Accordingly, the etch rate may be controlled in the center and outer portion of the wafer by adjusting currents applied to the inner coil and the outer coil. Thus, it may be inferred that an etch rate is proportional to a plasma density and the plasma density is proportional to a magnetic field. For example, when current applied to the inner coil increases, a magnetic field magnitude of a portion in which the inner coil is located may increase. The increased magnetic field magnitude may lead to a rise in plasma density. The rise in plasma density may result in an increase in etch rate in the corresponding portion of the wafer.

Meanwhile, a portion of the wafer that is about 100 mm apart from the center of the wafer may maintain almost the same etch rate irrespective of the ratio Iin/Iout. Thus, there may be dead zone in which a plasma density or a magnetic field magnitude may not be changed by adjusting currents applied to the inner coil and the outer coil. The dead zone may include a section or sections in which a magnetic field magnitude weakens due to interference between a magnetic field generated by the inner coil and a magnetic field generated by the outer coil. Due to the dead zone, uniformizing a distribution of magnetic fields by adjusting currents applied to the inner coil and the outer coil may be limited.

Accordingly, when the dead zone has a weak magnetic field magnitude, instead of adjusting current applied to the inner coil or outer coil, the magnetic-field control groove 120 may be formed in the dielectric window 100 at a portion or portions corresponding to the dead zone as illustrated in FIGS. 1A and 1B, based on the analysis of Equation (5), so that a magnetic field magnitude of a portion or portions of the chamber corresponding to the magnetic-field control groove(s) 120 may increase. Thus, the entire distribution of magnetic fields may be uniformized, and a distribution of plasma densities in the chamber may be uniformized due to the uniform distribution of magnetic fields.

Figure 4:
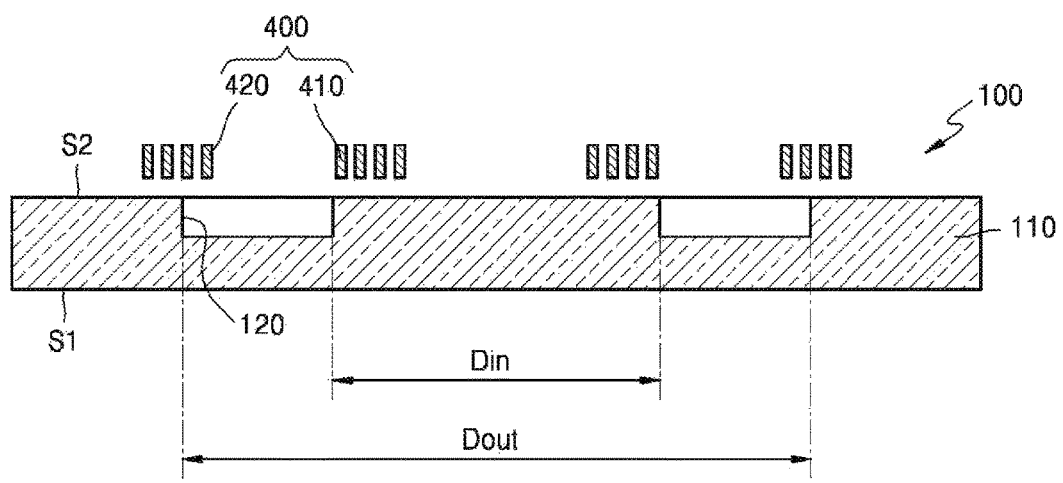
FIG. 4 is a cross-sectional view of a dielectric window according to an example embodiment.

FIG. 4 is a cross-sectional view of a dielectric window 100 according to an example embodiment, and FIGS. 5A to 6B are graphs of magnetic field magnitudes relative to positions and sizes of a magnetic-field control groove formed in the dielectric window 100 shown in FIG. 4. FIG. 4 shows a structure in which a coil antenna 400 is added to the dielectric window 100 of FIG. 1B.

Figure 15A:
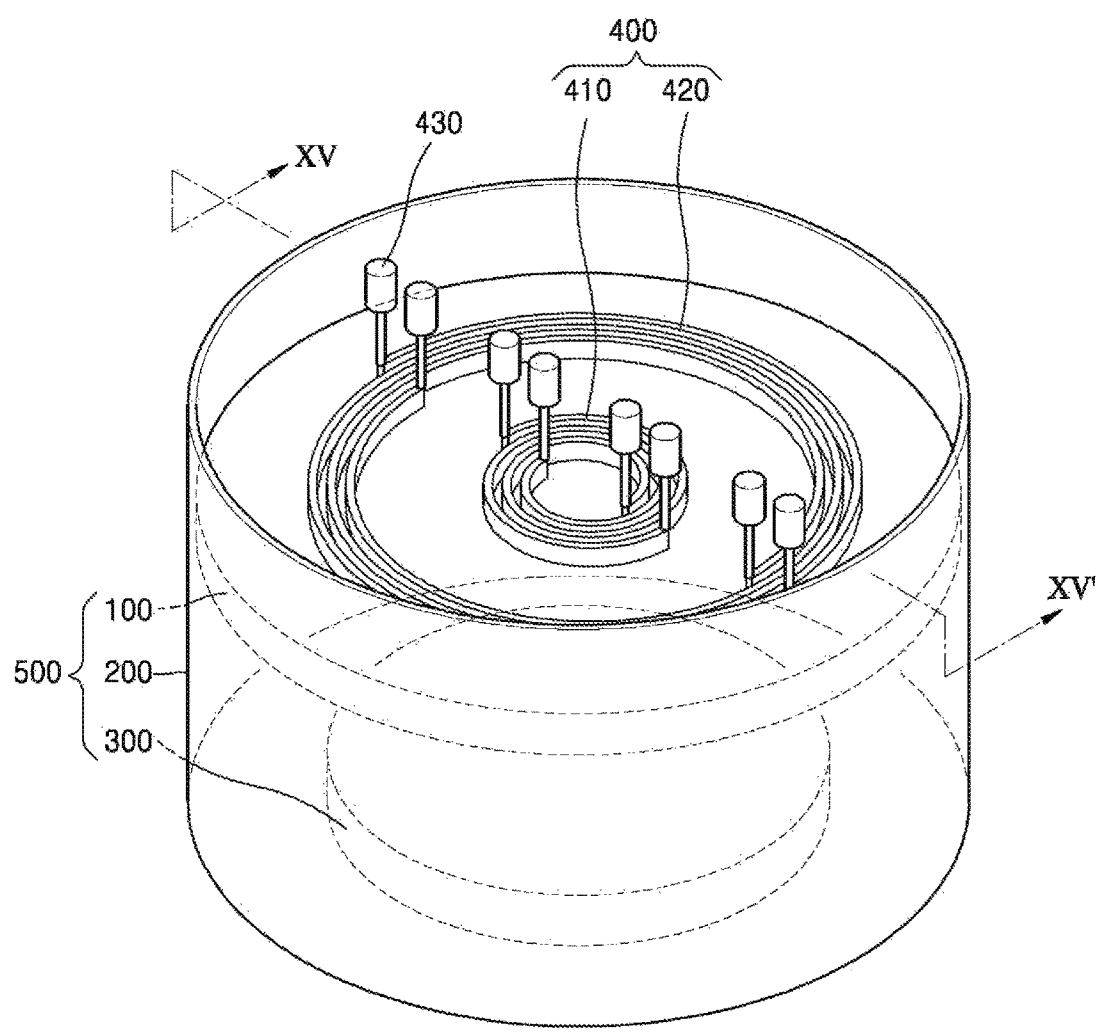
FIGS. 15A and 15B are a perspective view and a cross-sectional view of a chamber and a coil antenna, respectively, in the plasma process system of FIG. 14.

Referring to FIG. 4, the coil antenna 400 may include an inner coil 410 and an outer coil 420. As shown in FIG. 15A, the inner coil 410 may be located as a spiral type over a center of the dielectric window 100. The inner coil 410 may be connected to an upper RF power device (600 in FIG. 14) through a connection terminal 430 and receive RF power from the RF power device. The outer coil 420 may be located as a spiral type over an edge of the dielectric window 100. The outer coil 420 may be spaced apart from the inner coil 410 and at least partially surround the inner coil 410. Also, the outer coil 420 may be connected to the upper RF power device through the connection terminal 430 and receive RF power.

Interference between magnetic fields may occur and magnetic field magnitude may weaken in a lower portion of the dielectric window 100 that corresponds to a space between the inner coil 410 and the outer coil 420. Thus, the magnetic-field control groove 120 may be formed in a portion of the body 110 of the dielectric window 100 that corresponds to the space between the inner coil 410 and the outer coil 420. Meanwhile, a position, a size, and/or a depth of the magnetic-field control groove 120 may depend on a distribution of magnetic field generated under the dielectric window 100.

Figure 5A:
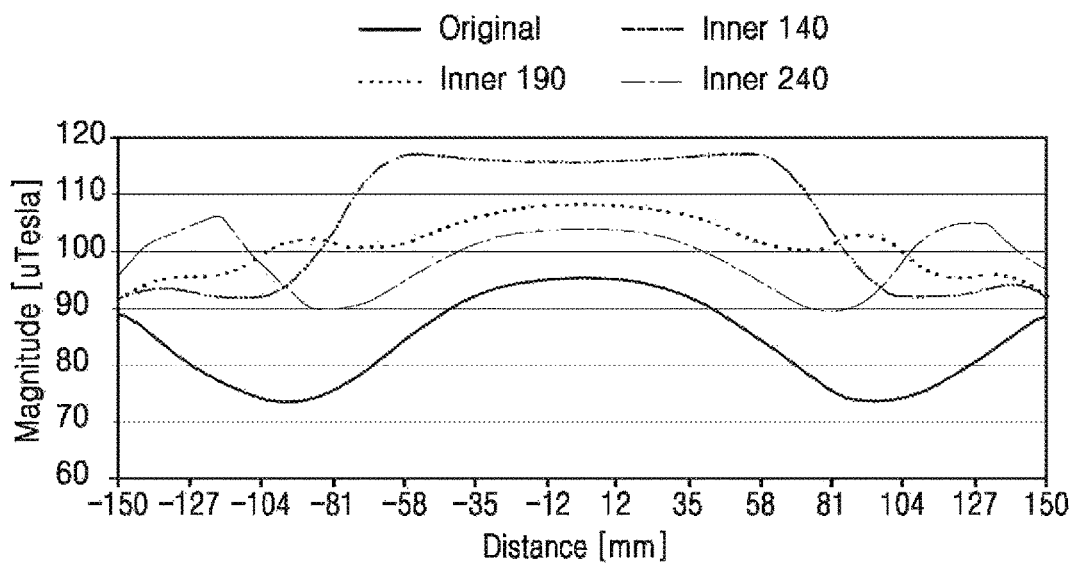
FIGS. 5A, 5B, 6A and 6B are curves of magnetic field magnitudes relative to positions and sizes of a magnetic-field control groove in the dielectric window shown in FIG. 4.

FIG. 5A shows a magnetic field magnitude in a lower portion of the dielectric window 100 of FIG. 4 relative to an inside diameter Din of the magnetic-field control groove 120 in the dielectric window 100 of FIG. 4. For example, FIG. 5A shows magnetic field magnitudes obtained when inside diameters Din of the magnetic-field control groove 120 are about 140 mm, about 190 mm, and about 240 mm. In this case, an outside diameter Dout of the magnetic-field control groove 120 may be fixed at about 320 mm. For reference, a solid curve indicates a magnetic field magnitude of a dielectric window of the related art in which a magnetic-field control groove is not formed.

As shown in FIG. 5A, when the inside diameter Din of the magnetic-field control groove 120 is about 190 mm, a magnetic field magnitude is uniform as compared with other cases and a substantially higher magnetic field magnitude is observed over the entire range as compared with a curve of the dielectric window of the related art. Meanwhile, the curve of the magnetic field magnitudes of the dielectric window of the related art is W shaped, and a portion having the lowest magnetic field magnitude or a portion adjacent thereto may correspond to a dead zone.

Figure 5B:
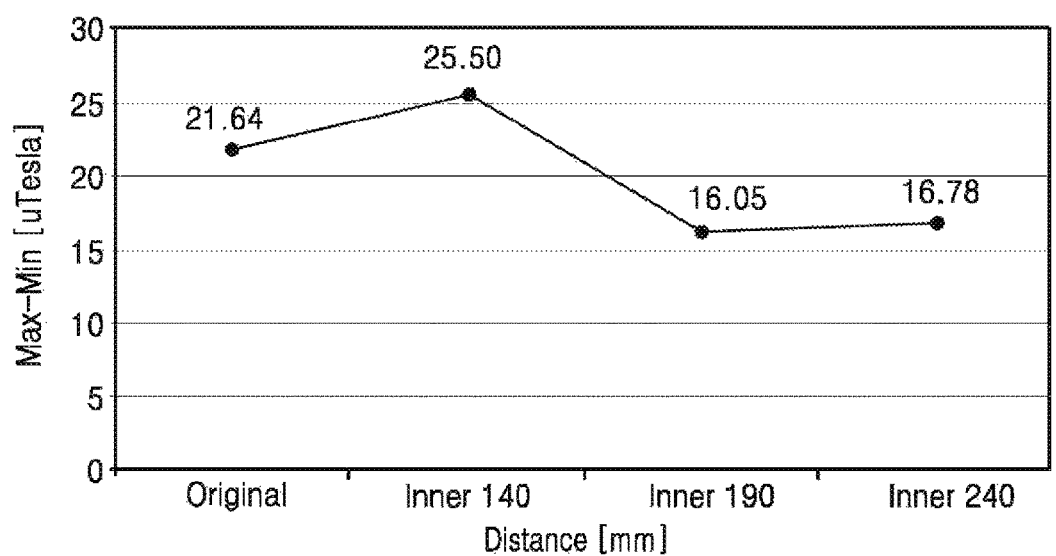

FIG. 5B shows differences Max–Min between maximum values and minimum values in respective curves of magnetic field magnitudes of FIG. 5A. A difference Max–Min between maximum and minimum values may stand for uniformity of a distribution of magnetic fields to some extent. That is, as the difference Max–Min between the maximum and minimum values is lower, uniformity of the distribution of magnetic fields is better.

For example, in the dielectric window of the related art, a difference Max–Min is about 21.64 μT. When the inside diameter Din of the magnetic-field control groove 120 is about 140 mm, the difference Max–Min is about 25.50 μT. When the inside diameter Din of the magnetic-field control groove 120 is about 190 mm, the difference Max–Min is about 16.05 μT. When the inside diameter Din of the magnetic-field control groove 120 is about 240 mm, the difference Max–Min is about 16.78 μT. Accordingly, among the above-described structures of the dielectric window 100 having the magnetic-field control groove 120, the uniformity of magnetic fields may be best in the dielectric window 100 in which the inner diameter Din of the magnetic-field control groove 120 is about 190 mm.

Figure 6A:
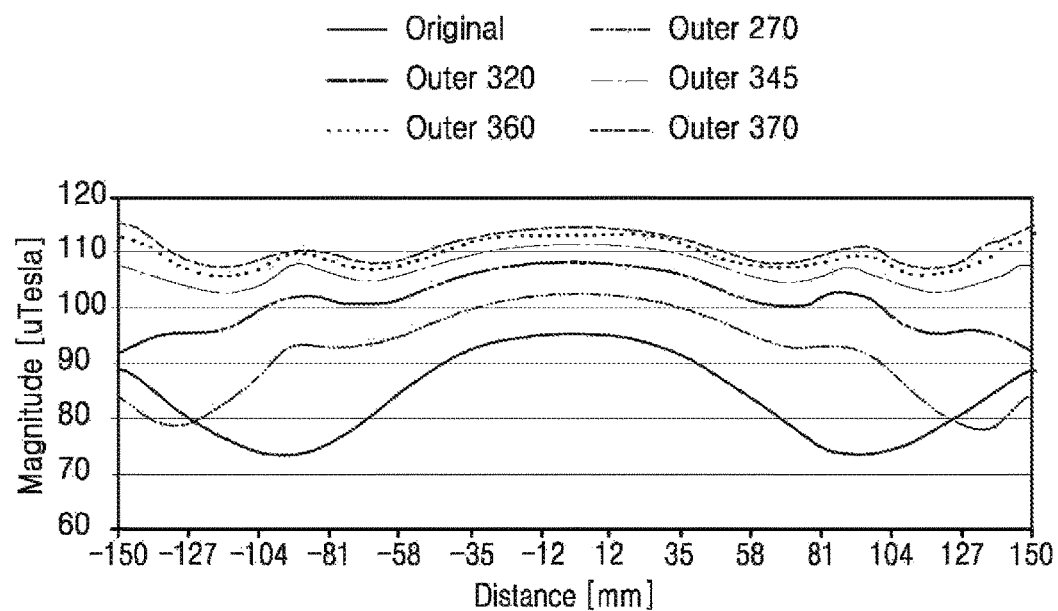

FIG. 6A shows a magnetic field magnitude in a lower portion of the dielectric window 100 of FIG. 4 relative to an outside diameter Dout of the magnetic-field control groove 120 in the dielectric window 100 of FIG. 4. For example, FIG. 6A show magnetic field magnitudes obtained when outside diameters Dout of the magnetic-field control groove 120 are about 270 mm, about 320 mm, about 345 mm, about 360 mm, and about 370 mm. In this case, an inside diameter Din of the magnetic-field control groove 120 may be fixed at about 190 mm at which the magnetic field magnitudes is most uniform as shown in FIGS. 5A and 5B. A solid curve indicates a magnetic field magnitude of a dielectric window of the related art in which a magnetic-field control groove is not formed. Referring to FIG. 6A, when the outer diameters Dout of the magnetic-field control groove 120 are about 360 mm and about 370 mm, magnetic field magnitudes are uniform and relatively high over the entire ranges as compared with curves of other cases.

Figure 6B:
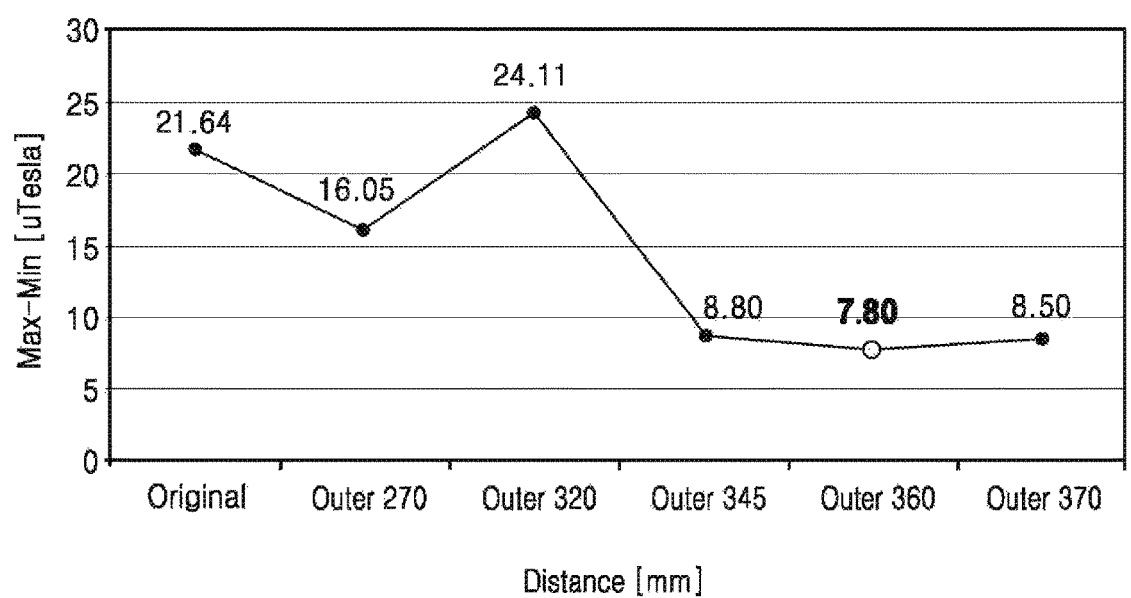

FIG. 6B shows differences Max–Min between maximum values and minimum values in respective curves of magnetic field magnitudes of FIG. 6A. For example, in the dielectric window of the related art, a difference Max–Min is about 21.64 μT. When the outside diameter Dout of the magnetic-field control groove 120 is about 270 mm, the difference Max–Min is 16.05 μT. When the outside diameter Dout of the magnetic-field control groove 120 is about 320 mm, the difference Max–Min is about 24.11 μT. When the outside diameter Dout of the magnetic-field control groove 120 is about 345 mm, the difference Max–Min is about 8.80 μT. When the outside diameter Dout of the magnetic-field control groove 120 is about 360 mm, the difference Max–Min is about 7.80 μT. When the outside diameter Dout of the magnetic-field control groove 120 is about 370 mm, the difference Max–Min is about 8.50 μT. Accordingly, among the above-described structures of the dielectric window 100 having the magnetic-field control groove 120, the magnetic fields is most uniform in the dielectric window 100 in which the outside diameter Dout of the magnetic-field control groove 120 is about 360 mm.

The analysis results obtained based on FIGS. 5A to 6B show that the dielectric window 100 having the magnetic-field control groove 120 having the inside diameter Din of about 190 mm and the outside diameter Dout of about 360 mm exhibits the best uniformity of a distribution of magnetic fields and has a much higher magnetic field magnitude than the dielectric window of the related art. Meanwhile, when the inside diameter Din and the outside diameter Dout of the magnetic-field control groove 120 are determined, the width of the magnetic-field control groove 120 may be naturally determined. For example, when the inside diameter Din and the outside diameter Dout of the magnetic-field control groove 120 are about 190 mm and about 360 mm, respectively, the width of the magnetic-field control groove 120 may be determined as about (360-190)/2=85 mm.

Figure 7:
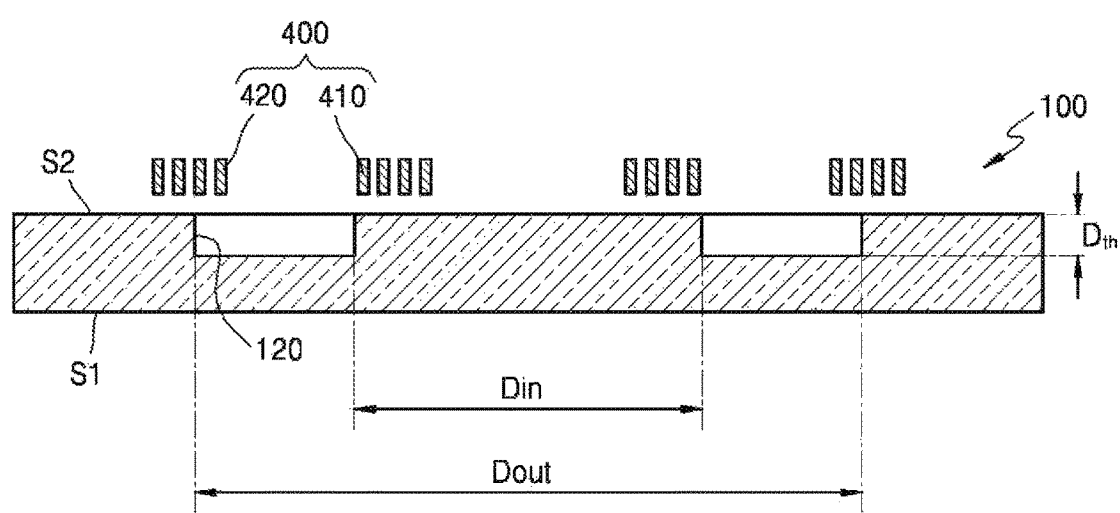
FIG. 7 is a cross-sectional view of a dielectric window according to an example embodiment.
Figure 8A:
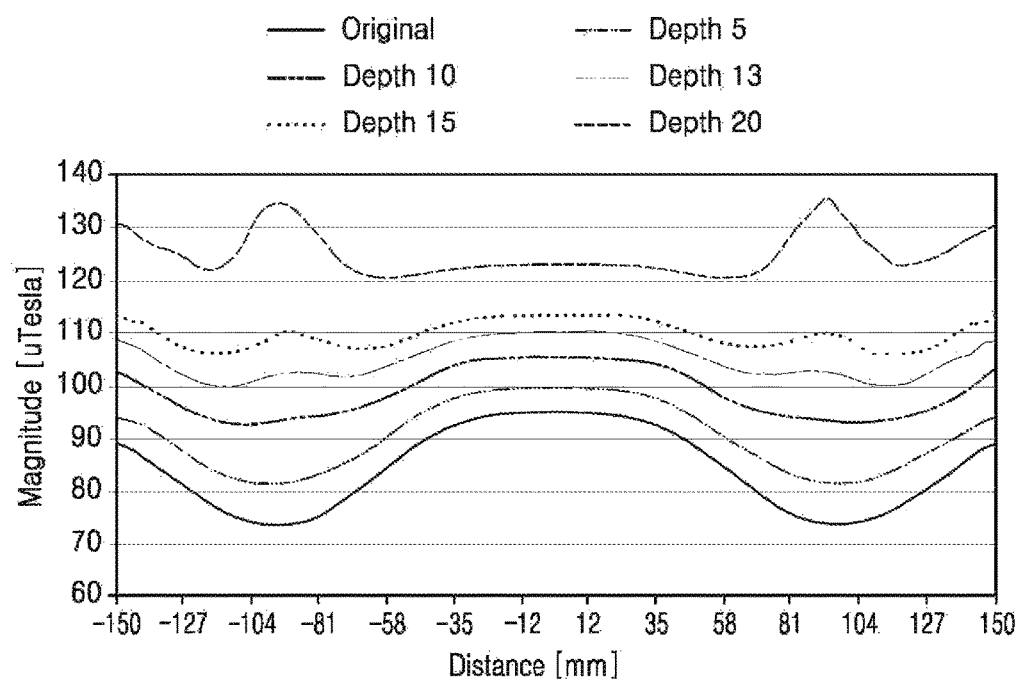
FIG. 8A shows curves of a magnetic field magnitude relative to a depth of a magnetic-field control groove in the dielectric window shown in FIG. 7.
Figure 8B:
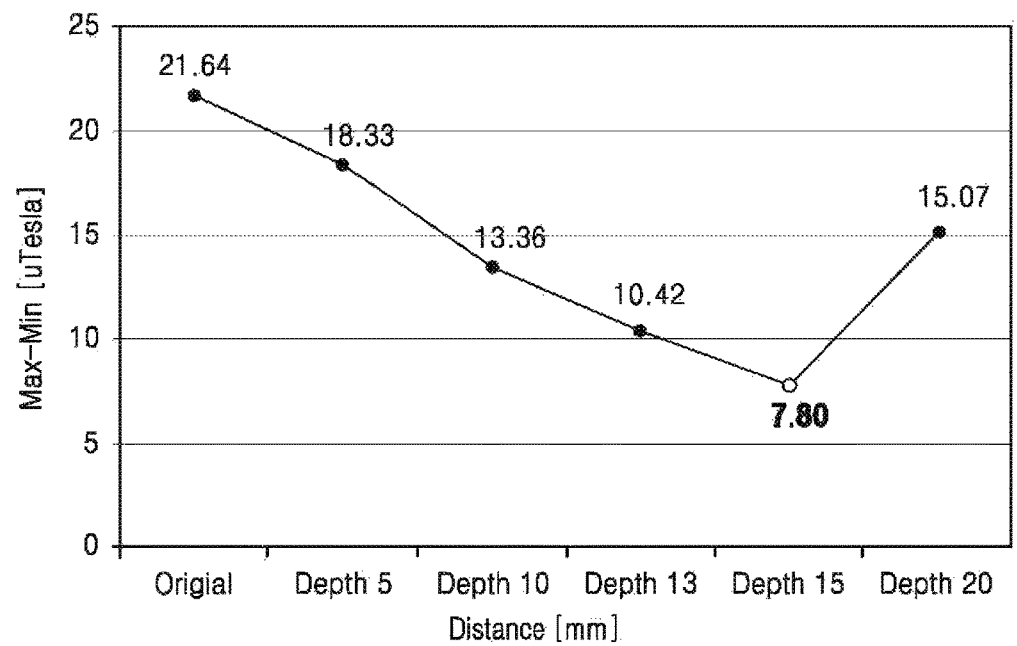
FIG. 8B shows differences Max–Min between maximum values and minimum values in the respective curves of magnetic field magnitudes shown in FIG. 8A.

FIG. 7 is a cross-sectional view of a dielectric window 100 according to an example embodiment, and FIGS. 8A and 8B are graphs of a magnetic field magnitude relative to a depth of a magnetic-field control groove in the dielectric window 100 shown in FIG. 7. Similar to FIG. 4, FIG. 7 shows a structure in which a coil antenna 400 is added to the dielectric window 100 of FIG. 1B.

Referring to FIG. 7, an inside diameter Din and an outside diameter Dout of the magnetic-field control groove 120 formed in the dielectric window 100 may be respectively about 190 mm and about 360 mm, as determined in FIGS. 5A to 6B.

FIG. 8A shows curves of a magnetic field magnitude in a lower portion of the dielectric window 100 of FIG. 7 relative to a depth Dth of the magnetic-field control groove 120 in the dielectric window 100 of FIG. 7. For example, FIG. 8A shows magnetic field magnitudes obtained when depths Dth of the magnetic-field control groove 120 are about 5 mm, about 10 mm, about 13 mm, about 15 mm, and about 20 mm. Similarly, a solid curve indicates a magnetic field magnitude of a dielectric window of the related art in which a magnetic-field control groove is not formed.

Referring to FIG. 8A, when the magnetic-field control groove 120 has the depth Dth of about 15 mm, magnitudes of a magnetic field are relatively high and a distribution of the magnetic fields is relatively uniform as compared with other cases, as well as the dielectric window of the related art. Meanwhile, when the magnetic-field control groove 120 has the depth Dth of about 20 mm, although magnetic field magnitudes are higher than in the other cases, the uniformity of a distribution of magnetic fields is not good. The uniformity of a distribution of magnetic fields at each depth of the magnetic-field control groove 120 may be appreciated with further clarity with reference to FIG. 8B.

FIG. 8B shows differences Max−Min between maximum values and minimum values in the respective curves of magnetic field magnitudes shown in FIG. 8A. For example, in the dielectric window of the related art, a difference Max−Min is about 21.64 µT. When the magnetic-field control groove 120 has the depth of about 5 mm, the difference Max−Min is about 18.33 µT. When the magnetic-field control groove 120 has the depth of about 10 mm, the difference Max−Min is about 13.36 µT. When the magnetic-field control groove 120 has the depth of about 13 mm, the difference Max−Min is about 10.42 µT. When the magnetic-field control groove 120 has the depth of about 15 mm, the difference Max−Min is about 7.80 µT. When the magnetic-field control groove 120 has the depth of about 20 mm, the difference Max−Min is about 15.07 µT. Accordingly, among the above-described structures of the dielectric window 100 having the magnetic-field control groove 120, the magnetic fields may be distributed in a most uniform manner in the dielectric window 100 in which the depth of the magnetic-field control groove 120 is about 15 mm.

Figure 9:
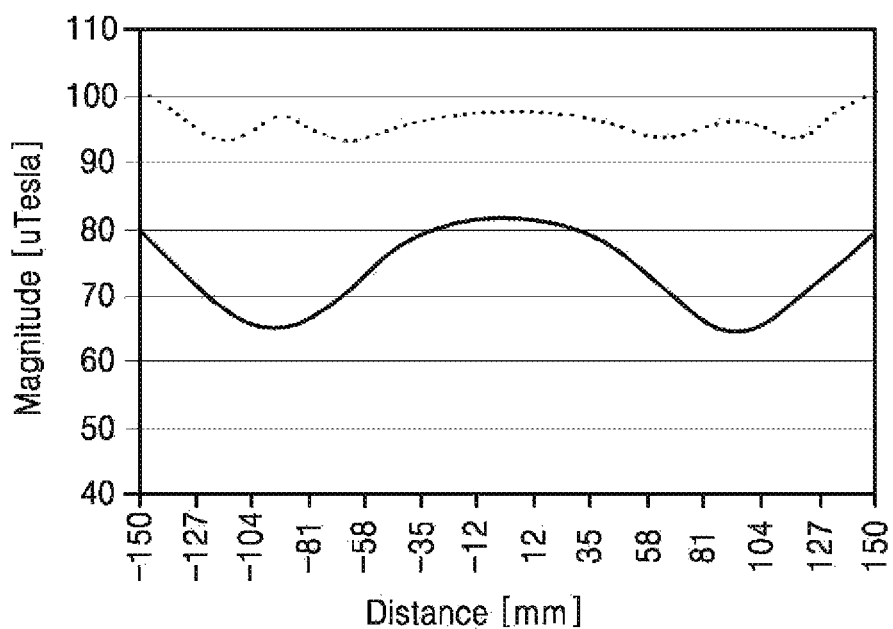
FIG. 9 shows curves of magnetic field magnitudes under a dielectric window, which is free from a magnetic-field control groove, and a dielectric window including an optimum magnetic-field control groove.

The analysis results obtained based on FIGS. 5A to 6B, 8A, and 8B are synthetically illustrated in FIG. 9.

For reference, magnetic field magnitudes and the uniformity of a distribution of magnetic fields in the chamber may be calculated by using simulations. Also, simulations of the magnetic field magnitudes and the uniformity of the distribution of magnetic fields may be performed based on detection data of plasma in the chamber or measurement data regarding a wafer after a plasma process is performed on the wafer.

FIG. 9 shows curves of magnetic field magnitudes under a dielectric window, which is free from a magnetic-field control groove, and a dielectric window including an optimum magnetic-field control groove.

Referring to FIG. 9, based on the curves of FIGS. 5A to 6B, 8A, and 8B, when the magnetic-field control groove 120 has the inside diameter Din of about 190 mm, the outside diameter Dout of about 360 mm, and the depth of about 15 mm, as illustrated with a dotted curve, a distribution of magnetic fields is uniform over substantially an entire range under the dielectric window 100, and magnetic field magnitudes are relatively high as compared with a solid curve of the dielectric window of the related art. According to some example embodiments as describe above, a difference Max−Min between the maximum and minimum magnetic field magnitudes may have a relatively low value of, for example, about 7.80 µT under the dielectric window 100.

In the dielectric window 100 according to the present example embodiment, the magnetic-field control groove 120 may be formed in the top surface S2 of the body 110 such that the uniformity of magnetic fields is optimized and magnetic field magnitudes are increased. Magnetic field magnitudes under the dielectric window 100 may be analyzed as described with reference to FIGS. 4 to 8B, and a position(s), a size(s), and a depth(s) of the magnetic-field control groove 120 may be appropriately determined to optimize the uniformity of magnetic fields and/or increase magnetic field magnitudes. Thus, due to the optimized uniformity of magnetic fields and the increased magnetic field magnitudes, the dielectric window 100 according to the present example embodiments may increase the uniformity and density of plasma in the chamber and enable a stable plasma process in the chamber.

FIGS. 10A and 10B show (1) a stimulation image of magnetic field magnitudes in a chamber adopting a dielectric window of the related art, which is free from a magnetic-field control groove, and (2) a stimulation image of magnetic field magnitudes in a chamber adopting a dielectric window including a magnetic-field control groove according to an example embodiment, respectively. In other words, FIG. 10A is a stimulation image of a chamber adopting the dielectric window of the related art, and FIG. 10B is a stimulation image of the chamber adopting the dielectric window according to some example embodiments of the present inventive concepts. In each of FIG. 10A and FIG. 10B, an upper portion is a stimulation image of a vertical cross-section of the inside of the chamber, and a lower portion is a stimulation image of a horizontal cross-section, which is taken a distance of about 10 mm or less from a bottom surface of the dielectric window.

Referring to FIG. 10A, based on a 300-mm wafer, magnetic field magnitudes are high in a central portion and an outer portion (bright portions) of the chamber adopting the dielectric window of the related art, which is free from the magnetic-field control groove, and low in middle portions (dark portions) between the central and outer portions. In contrast, Referring to FIG. 10B, a distribution of magnetic field magnitudes are substantially uniform and magnetic field magnitudes are relatively high from a central portion to an outer portion of the chamber adopting the dielectric window having the magnetic-field control groove according to some example embodiments of the present inventive concepts.

Figure 11:
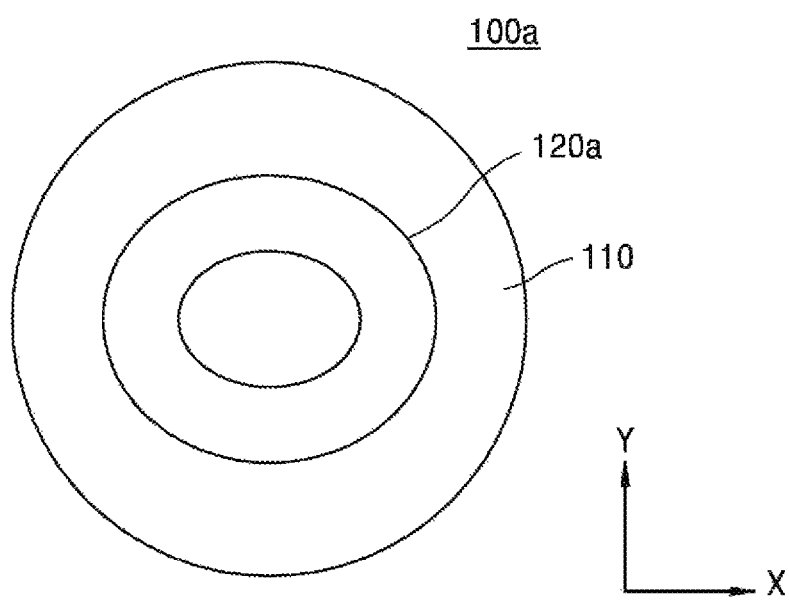
FIG. 11 is a plan view of a dielectric window according to an example embodiment.

FIG. 11 is a plan view of a dielectric window 100a according to an example embodiment. The same descriptions of the dielectric window 100a as in the dielectric window 100 shown in FIGS. 1A and 1B will be simplified or omitted.

Referring to FIG. 11, the dielectric window 100a according to the present example embodiment may differ from the dielectric window 100 of FIG. 1A in terms of a structure of a magnetic-field control groove 120a. For example, in the dielectric window 100a according to the present example embodiment, a magnetic-field control groove 120a may be formed as an elliptical ring type in a center portion of a body 110. The magnetic-field control groove 120a formed in the dielectric window 100a is not limited to a circular ring shape or an elliptical ring shape. For example, the magnetic-field control groove 120a may have a polygonal ring shape (e.g., a tetragonal ring shape or a pentagonal ring shape).

As described with reference to FIGS. 4 to 9, a shape or positions of the magnetic-field control groove may be variously adjusted in consideration of a distribution of magnetic fields formed under the dielectric window and a distribution of plasma densities affected by the distribution of magnetic fields. For example, when a relatively high plasma density is desired for a portion that is adjacent to the central portion along a y-axis on an x-y plane, an elliptical ring-shaped magnetic-field control groove having an x-axis as a major axis and an x-axis as a minor axis may be formed similar to the structure shown in FIG. 11.

Figure 12A:
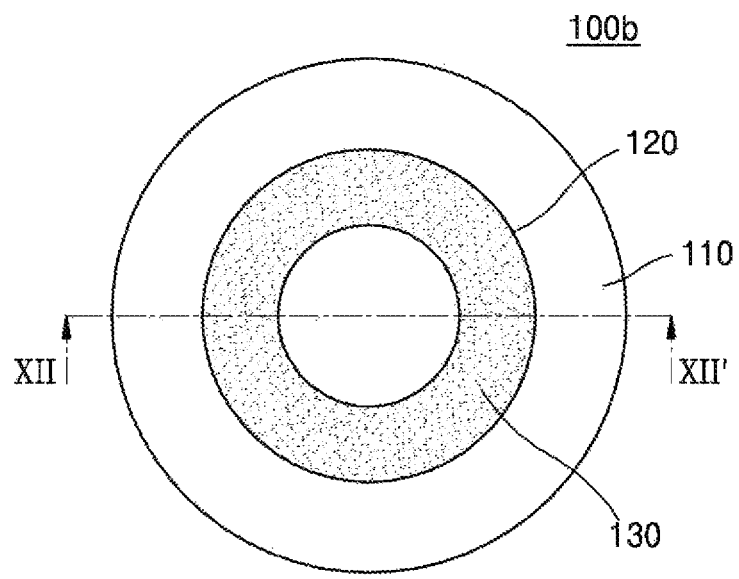
FIGS. 12A and 12B are a plan view and a cross-sectional view of a dielectric window according to an example embodiment, respectively.
Figure 12B:
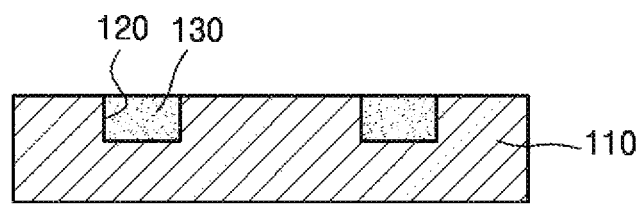

FIGS. 12A and 12B are a plan view and a cross-sectional view of a dielectric window 100b according to an example embodiment, respectively. FIG. 12B is a cross-sectional view taken along line XII-XII' of FIG. 12A. The same descriptions of the dielectric window 100b as in the dielectric window 100 shown in FIGS. 1A and 1B will be simplified or omitted.

Referring to FIGS. 12A and 12B, the dielectric window 100b according to the present example embodiment may differ from the dielectric window 100 of FIG. 1A in that a magnetic-field control groove 120 is filled with a dielectric material different from a dielectric material included in a body 110. Referring to the dielectric window 100 of FIG. 1A, the magnetic-field control groove 120 may be formed in the body 110 and remain vacant. Accordingly, a bottom surface and inner side surfaces of the magnetic-field control groove 120 may be exposed.

By comparison, in the dielectric window 100*b* according to the present example embodiment, a material layer 130 having a different dielectric constant from the body 110 may be formed in the magnetic-field control groove 120. The material layer 130 may have a lower dielectric constant or a higher magnetic permeability than a dielectric material included in the body 110. For example, when the body 110 includes alumina having a dielectric constant of about 9 to 10, the material layer 130 may be formed by filling the magnetic-field control groove 120 with a material (e.g., quartz, glass, Teflon, or plastic) having a lower dielectric constant than alumina or a material (e.g., iron, Permalloy, or Ferrite) having a higher magnetic permeability than alumina. As a dielectric constant of a material decreases, a magnetic field may increase, and as a magnetic permeability of the material increases, the magnetic field may increase. Accordingly, the magnetic-field control groove 120 may be filled with a material having a relatively low dielectric constant and/or a material having a relatively high magnetic permeability to increase a magnetic field.

Meanwhile, air may have a dielectric constant of about 1, which is close to that of a vacuum. Accordingly, when the magnetic-field control groove 120 is not filled with any dielectric material but remains vacant, it may be understood that the magnetic-field control groove 120 is filled with a material having the lowest dielectric constant compared to the body 110. As described above, a magnetic field magnitude may be higher under a portion of the dielectric window having a relatively low dielectric constant than under a portion of the dielectric window having a relatively high dielectric constant. Accordingly, after the magnetic-field control groove 120 is formed, the magnetic-field control groove 120 may remain vacant or be filled with a material having a lower dielectric constant than the body 110 so that a magnetic field magnitude in a portion of the dielectric window 100*b* corresponding to the magnetic-field control groove 120 may increase.

In order to abruptly vary a magnetic field magnitude in the magnetic-field control groove 120, the magnetic-field control groove 120 may be maintained vacant so that a difference in dielectric constant between the body 110 and the magnetic-field control groove 120 may be enlarged. In contrast, in order to minutely vary a magnetic field magnitude in the magnetic-field control groove 120, the magnetic-field control groove 120 may be filled with a dielectric material so that a difference in dielectric constant between the body 110 and the magnetic-field control groove 120 is not great.

Furthermore, in order to adjust a magnetic field magnitude by forming the magnetic-field control groove 120, the magnetic field magnitude may be controlled to be substantially the same by (1) forming the magnetic-field control groove 120 to a small depth and maintaining the magnetic-field control groove 120 vacant or (2) forming the magnetic-field control groove 120 to a great depth and filling a material layer 130 having an appropriate dielectric constant in the magnetic-field control groove 120. Accordingly, whether to maintain the magnetic-field control groove 120 vacant or to fill the magnetic-field control groove 120 with a dielectric material to form the material layer 130 may be appropriately chosen in consideration of costs of materials and/or process difficulty in a process of forming a dielectric window.

Further, when the magnetic-field control groove 120 is filled with a dielectric material to form the material layer 130, the material layer 130 may protect or prevent the bottom surface and side surface of the magnetic-field control groove 120 from being exposed so that the magnetic-field control groove 120 may be inhibited or prevented from being contaminated with foreign materials penetrating into the magnetic-field control groove 120.

Figure 13A:
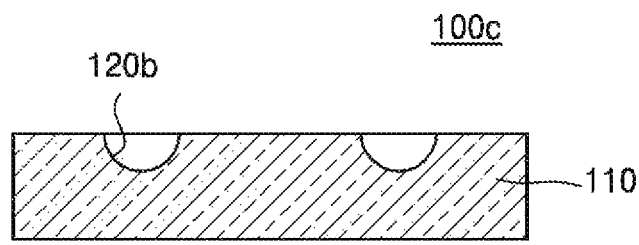
FIGS. 13A, 13B, and 13C show cross-sectional views of dielectric windows according to some example embodiments, which correspond to FIG. 1B.
Figure 13B:
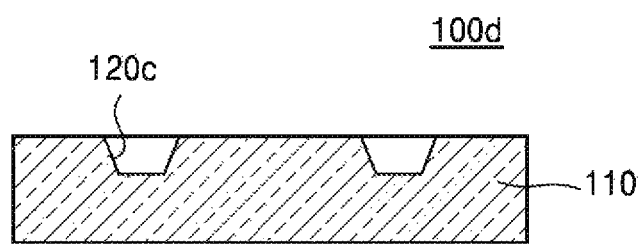
Figure 13C:
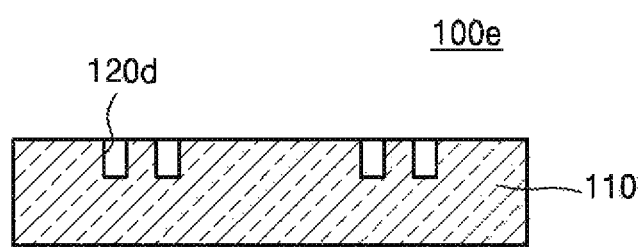

FIGS. 13A, 13B, and 13C show cross-sectional views of dielectric windows 100*c*, 100*d*, and 100*e* according to some example embodiments, which correspond to FIG. 1B. The same descriptions of the dielectric windows 100*c*, 100*d*, and 100*e* as in the dielectric window 100 shown in FIGS. 1A and 1B will be simplified or omitted.

Referring to FIGS. 13A, 13B, and 13C, each of the dielectric windows 100*c*, 100*d*, and 100*e* according to the present example embodiments may differ from the dielectric window 100 of FIG. 1A in terms of cross-sectional structures of magnetic-field control grooves 120*b*, 120*c*, and 120*d*. For example, a cross-section of the magnetic-field control groove 120 of the dielectric window 100 of FIG. 1A may be rectangular shaped as can be seen from FIG. 1B. By comparison, in the dielectric window 100*c* shown FIG. 13A according to an example embodiment, a cross-section of the magnetic-field control groove 120*b* may be semicircular shaped. In the dielectric window 100*d* shown in FIG. 13B according to an example embodiment, a cross-section of the magnetic-field control groove 120*c* may be trapezoidal shaped. In the dielectric windows according to the present example embodiments, the cross-sections of the magnetic-field control grooves are not limited to the rectangular shape, the semicircular shape, or the trapezoidal shape.

In the dielectric window 100*e* shown in (c) of FIG. 13C according to an example embodiment, each of the magnetic-field control grooves 120*d* may include two fine grooves. The number of fine grooves included in the magnetic-field control groove 120*d* is not limited to 2. For example, at least three fine grooves may be included in the magnetic-field control groove 120*d*. Thus, a plurality of fine grooves may be formed in the body 110 so that the magnetic-field control groove 120*d* may be provided in the dielectric window 100*e*.

Horizontal sections (e.g., plan views) of the magnetic-field control grooves 120*b*, 120*c*, and 120*d* of the dielectric windows 100*c*, 100*d*, and 100*e* shown in FIGS. 13A, 13B, and 13C, respectively, may be circular ring shaped as the magnetic-field control groove 120 illustrated in FIG. 1A. However, the horizontal sections of the magnetic-field control grooves 120*b*, 120*c*, and 120*d* are not limited to the circular ring shape. For instance, the horizontal sections of the magnetic-field control grooves 120*b*, 120*c*, and 120*d* may be, for example, elliptical ring shaped or polygonal ring shaped.

In the dielectric windows 100*c*, 100*d*, and 100*e* shown in FIGS. 13A, 13B, and 13C, respectively, the magnetic-field control grooves 120*b*, 120*c*, and 120*d* may be filled with a different material from the body 110 to form material layers.

Thus far, structures of dielectric windows having magnetic-field control grooves having various shapes according to some example embodiments have been described. However, the inventive concepts are not limited thereto. For example, when a groove is formed in a top surface (S2 in FIG. 1B) of a dielectric window included in a chamber used for a plasma process and a magnetic field magnitude and/or the uniformity of a distribution of magnetic fields in the chamber are adjusted by the groove, the dielectric window including the groove may fall within the spirit and scope of the inventive concepts irrespective of a shape or sizes of the grooves.

FIG. 14 is a schematic construction diagram of a plasma process system 1000 including a dielectric window according to an example embodiment. The same descriptions as in FIGS. 1A to 13 will be simplified or omitted.

Referring to FIG. 14, the plasma process system 1000 according to the present example embodiment may include a chamber 500, a coil antenna 400, an upper RF power device 600, and a lower RF power device 700.

The chamber 500 may include a dielectric window 100, an outer wall 200, and an electrostatic chuck (ESC) 300. The outer wall 200 may define a reaction space, in which plasma is generated, and hermetically seal the reaction space from the outside. The outer wall 200 may typically include a metallic material and remain grounded to block noise from the outside during a plasma process. An insulating liner (not shown) may be located inside the outer wall 200. The insulating liner may protect the outer wall 200 and/or cover metal structures protruding from the outer wall 200 to inhibit or prevent occurrence of arcing in the chamber 500. The insulating liner may include ceramic or quartz.

Although not shown, at least one viewport may be formed in the outer wall 200, and the inside of the chamber 500 may be monitored through the viewport. For example, the viewport may be combined with a probe or an optical emission spectroscopy (OES) system to detect a plasma density in the chamber 500.

The ESC 300 may be located in a lower portion of the chamber 500, and a wafer 200 may be located on and fixed to a top surface of the ESC 300. The ESC 300 may fix a wafer 2000 using electrostatic force. The ESC 300 may include electrostatic electrodes configured to chuck and dechuck a wafer and receive power from, for example, a direct-current (DC) clamp power device. Meanwhile, other control systems configured to load or unload the wafer 2000 to or from the ESC 300 may be provided inside and outside the chamber 500.

The dielectric window 100 may cover a top surface of the outer wall 200 by being combined with the outer wall 200. The dielectric window 100 may be, for example, the dielectric window 100 described with reference to FIG. 1A. The dielectric window used for the chamber 500 is not limited to the dielectric window 100 of FIG. 1A. For instance, one of the dielectric windows 100a to 100e of FIGS. 11 to 13 may be combined with the outer wall 200 to form the chamber 500.

As described in FIG. 1A, a magnetic-field control groove 120 may be formed in a top surface S2 of the dielectric window 100. A bottom surface 51 of the dielectric window 100 may face the inside of the chamber 500, while the top surface S2 of the dielectric window 100 may face the outside of the chamber 500. Thus, because the magnetic-field control groove 120 is out of contact with plasma generated in the chamber 500, damage or contamination due to plasma may be inhibited or prevented.

Meanwhile, a through hole (not shown) may be formed in the center of the dielectric window 100. When the dielectric window 100 is combined with the outer wall 200 and forms the chamber 500, the through hole may be combined with a process gas supply head. The process gas supply head may penetrate the through hole and be combined with the through hole, and a plurality of fine spray holes may be formed in a bottom surface and a side surface of the process gas supply head. Thus, process gases may be sprayed into the chamber 500 through the spray holes. Because the magnetic-field control groove 120 of the dielectric window 100 is described in detail with reference to FIGS. 1A to 9, further descriptions thereof will be omitted.

The coil antenna 400 may include an inner coil 410 and an outer coil 420. As shown in FIG. 14, the coil antenna 400 may be located above the dielectric window 100. For example, the inner coil 410 may be located over the center of the dielectric window 100, and the outer coil 420 may be located over an edge of the dielectric window 100. Further, the outer coil 420 may be located apart from the inner coil 410 and at least partially surround the inner coil 410. Meanwhile, as described above, the magnetic-field control groove 120 may be formed in a portion of the top surface S2 of the dielectric window 100, which corresponds to a space between the inner coil 410 and the outer coil 420.

The inner coil 410 and the outer coil 420 of the coil antenna 400 may be connected to the upper RF power device 600 through interconnection circuits. For example, internal connection terminals (430 in FIG. 15A) of the outer coil 420 may be connected to a node 446 and connected to a matcher 620 of the RF power device 600 via a variable capacitor 456 and a node 444. As shown in FIG. 14, the variable capacitor 456 may be located between nodes 446 and 444. Further, external connection terminals of the outer coil 420 may be connected to a node 442 connected to a capacitor 452. As shown in FIG. 14, the capacitor 452 may be located between a ground and the node 442.

Meanwhile, in the inner coil 410, the internal connection terminals may be connected to a node 440 and connected to the RF power device 600 through a variable capacitor 454, an inductor 450, and the node 444. The variable capacitor 454 and the inductor 450 may be located between the nodes 440 and 444. Also, outer connection terminals of the inner coil 410 may be connected to a node 448 to which a ground is connected.

The RF power device 600 may tune powers supplied to the inner coil 410 and the outer coil 420 due to dynamic tuning functions of the variable capacitors 454 and 456. In some example embodiments, the coil antenna 400 and interconnection circuits may be tuned to supply higher power to any one of the inner coil 410 and the outer coil 420 than to the other or supply equal power to the inner coil 410 and the outer coil 420. In some example embodiments, currents may be adjusted by the variable capacitors 454 and 456 and flow in a desired (or alternatively, predetermined) ratio in the inner coil 410 and the outer coil 420.

Meanwhile, the shown interconnection circuits is provided as an example, and configurations of interconnection circuits of the plasma process system 1000 according to example embodiments of the present inventive concepts are not limited thereto. For example, interconnection circuits having various other configurations may be applied to the plasma process system 1000 according to the example embodiments of the present inventive concepts so that currents may be tuned or adjusted in a desired ratio.

The upper RF power device 600 may include an RF generator 610 and a matcher 620. The RF generator 610 may generate RF power, and the matcher 620 may regulate an impedance and stabilize plasma. A plurality of RF generators 610, for example, at least two RF generators 610, may be provided. When a plurality of RF generators 610 are provided, different frequencies may be used to embody various tuning characteristics. The matcher 620 may be connected to the coil antenna 400 through the interconnection circuits. In some cases, the matcher 620 may be interpreted as including the interconnection circuits.

Similarly, the lower RF power device 700 may include an RF generator 710 and a matcher 720 and apply RF power to the wafer 2000. RF power may be applied to the wafer 2000 through the ESC 300 or directly applied to the wafer 2000. A plurality of RF generators 710, for example, at least two RF generators 710, may be provided, and different frequencies may be used to embody various tuning characteristics. The matcher 720 may be located between the ESC 300 and the RF generator 710.

Meanwhile, gas sources may be combined with the chamber 500 via a gas inlet and supply a process gas desired for a plasma process through the gas inlet to the process gas supply head. Here, the process gas may refer to all gases (e.g., a source gas, a reactant gas, and a purge gas) desired for the plasma process. In some cases, the gas inlet may be directly connected to the inside of the chamber 500 so that a specific process gas may be directly supplied into the chamber 500. Further, a pumping device may be combined with the chamber 500 through an exhaust pipe, and exhaust byproducts of a gas, which is generated in the chamber 500 during the plasma process, using a vacuum pumping operation. The pumping device may serve to regulate a pressure in the chamber 500.

A probe or an OES system (not shown) may be combined with a view-port (not shown) of the chamber 500 and be electrically connected to an analysis system (not shown). The analysis system may analyze a plasma state (e.g., plasma density or uniformity) in the chamber 500 by using an analysis program based on data regarding plasma received from the probe or the OES system. Magnitudes and a distribution of magnetic fields under the dielectric window 100 located in the chamber 500 may be analyzed by analyzing the plasma state. In some cases, after a plasma process, data regarding the wafer 2000 may be measured, and the magnitudes and distribution of magnetic fields under the dielectric window 100 located in the chamber 500 may be analyzed based on the measured data.

The plasma process system 1000 according to the present example embodiment may include the chamber 500 in which the magnetic-field control groove 120 is formed in the top surface of the dielectric window 100. Thus, the uniformity of a distribution of magnetic fields in the chamber 500 and the uniformity of a distribution of plasma densities may be improved in a plasma process. Thus, the plasma process system 1000 according to the present example embodiment may enable a stable plasma process due to the improved plasma uniformity. Also, the plasma process system 1000 according to the present example embodiment may fabricate an more reliable semiconductor device by using a stable plasma process. Further, because the magnetic-field control groove 120 is formed in the top surface of the dielectric window 100, the magnetic-field control groove 120 may be inhibited or prevented from being damaged, contaminated, or deformed due to plasma generated in the chamber 500. Still further, the magnetic-field control groove 120 may not physically affect the flow of plasma in the chamber 500.

Figure 15B:
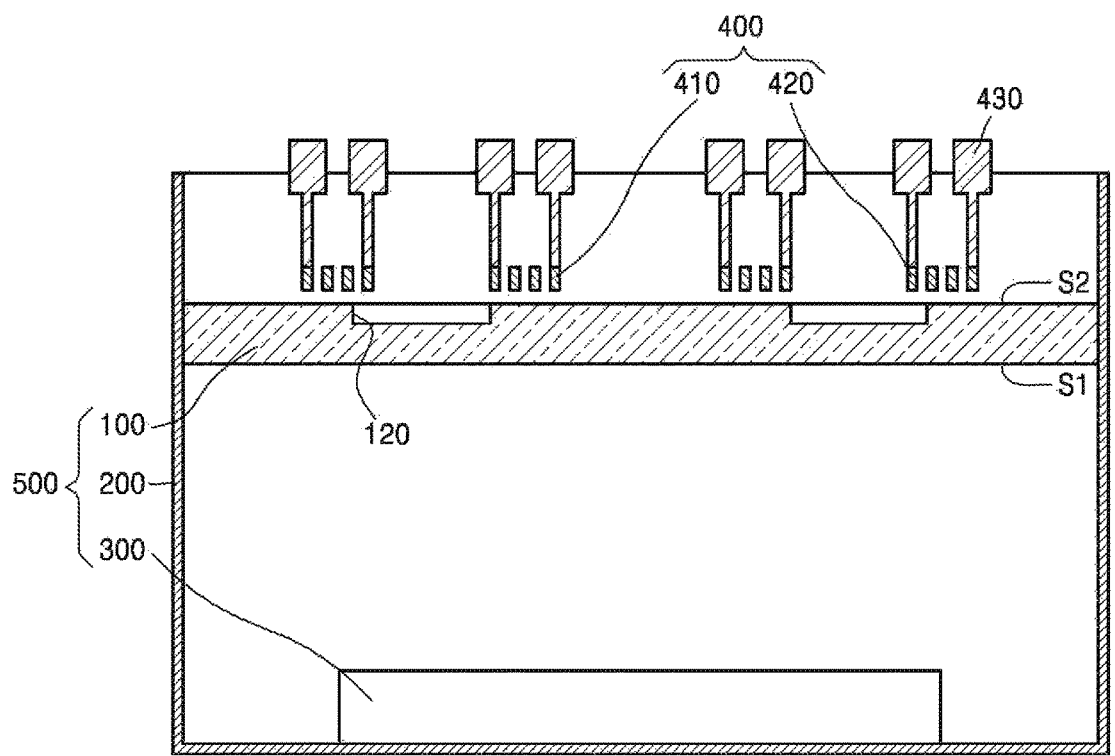

FIGS. 15A and 15B are a perspective view and a cross-sectional view of a chamber 500 and a coil antenna 400, respectively, in the plasma process system of FIG. 14. FIG. 15B is a cross-sectional view taken along a line XV-XV' of FIG. 15A. The same descriptions as in FIGS. 1A to 14 will be simplified or omitted.

Referring to FIGS. 15A and 15B, the chamber 500 may include a dielectric window 100 located in an upper portion of an outer wall 200, and a magnetic-field control groove 120 may be formed in a top surface S2 of the dielectric window 100.

A coil antenna 400 may be located over the dielectric window 100 and include an inner coil 410 and an outer coil 420. Each of the inner coil 410 and the outer coil 420 may have a spiral structure. The inner coil 410 may be located over a center of the dielectric window 100, while the outer coil 420 may be located over an edge of the dielectric window 100 and at least partially surround the inner coil 410. The magnetic-field control groove 120 may be formed in a portion of the top surface of the dielectric window 100 that corresponds to a space between the inner coil 410 and the outer coil 420.

The inner coil 410 and the outer coil 420 may be electrically connected to an upper RF power device (600 in FIG. 14) by using connection terminals 430. For example, each of the inner coil 410 and the outer coil 420 may be connected to four connection terminals 430. Among the four connection terminals 430 connected to the outer coil 420, two connection terminals 430 on an outer side may be connected to a ground, and two connection terminals 430 on an inner side may be connected to a matcher (630 in FIG. 14). Also, among the four connection terminals 430 connected to the inner coil 410, two connection terminals 430 on an outer side may be connected to the ground, and two connection terminals 430 on an inner side may be connected to the matcher 630. Meanwhile, as in the plasma process system shown in FIG. 14, a capacitor, a varactor, and/or an inductor may be located between the connection terminal 430 and the ground or matcher 630. Circuit configurations between the connection terminals 430 connected to the inner coil 410 and the outer coil 420 and the upper RF power device (600 in FIG. 14) are not limited to those shown in FIG. 14.

Figure 16:
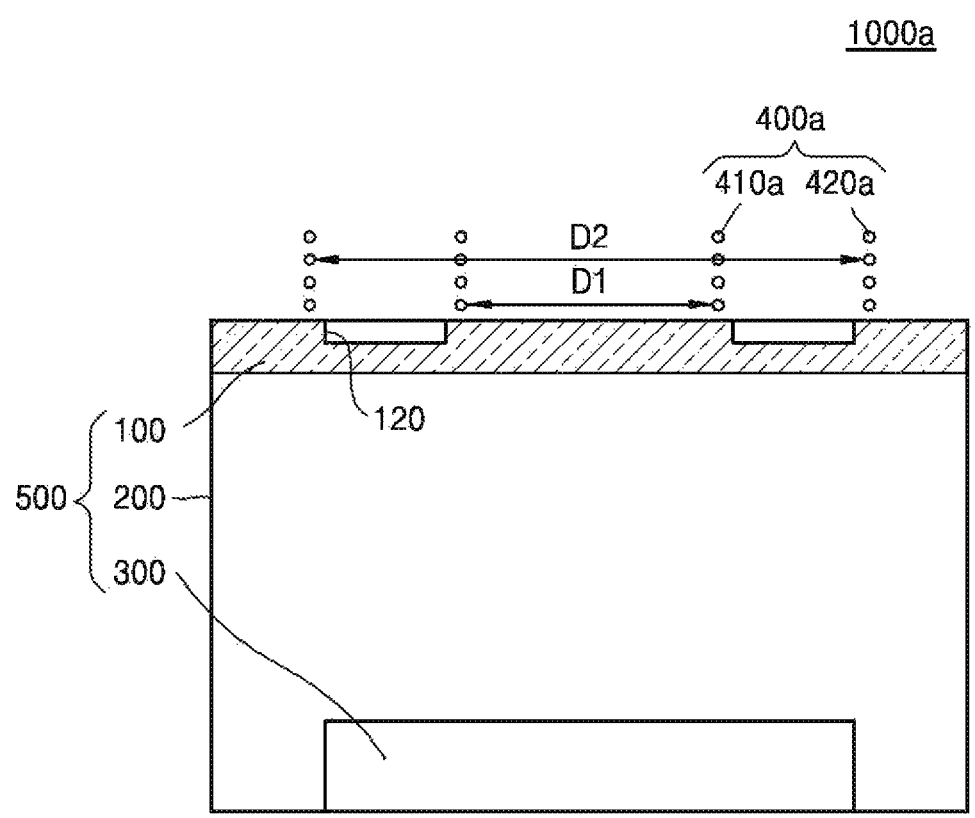
FIGS. 16, 17, and 18 are schematic construction diagrams of plasma process systems including dielectric windows according to some example embodiments.

FIGS. 16, 17, and 18 are schematic construction diagrams of plasma process systems 1000*a*, 1000*b*, and 1000*c* including dielectric windows according to some example embodiments. The same descriptions as in FIGS. 1A to 14 will be simplified or omitted.

Referring to FIG. 16, the plasma process system 1000*a* may differ from the plasma process system 1000 of FIG. 14 in terms of a structure of a coil antenna 400*a*. For example, in the plasma process system 1000*a* according to the present example embodiments, the coil antenna 400*a* may be located over a dielectric window 100 and include an inner coil 410*a* and an outer coil 420*a* as in the plasma process system 1000 of FIG. 14. However, each of the inner coil 410*a* and the outer coil 420*a* may have not a planar spiral structure but a three-dimensional (3D) structure extending upward.

For example, the inner coil 410*a* may have a cylindrical spring structure that may wind an outer surface of a cylinder and extend upward. The cylinder is a virtual structure, and the inner coil 410*a* may have the cylindrical spring structure and extend upward. For example, the virtual cylinder being wound by the inner coil 410*a* may be located over a center of the dielectric window 100 and have an inner diameter of a first diameter D1.

The outer coil 420*a* also may have a cylindrical spring structure and extend upward. For example, the outer coil 420*a* may be located over an edge of the dielectric window 100 and have an inside diameter of a second diameter D2. Also, as shown in FIG. 16, the outer coil 420*a* may at least partially surround the inner coil 410*a* and be spaced a desired (or alternatively, predetermined distance) apart from the inner coil 410*a*. Thus, the second diameter D2 of the outer coil 420*a* may be greater than the first diameter D1 of the inner coil 410a. For example, the second diameter D2 of the outer coil 420a may be at least twice greater than the first diameter D1 of the inner coil 410a. The relative sizes of the second diameter D2 and the first diameter D1 are not limited thereto.

Similarly, in the plasma process system 1000a according to the present example embodiment, a magnetic-field control groove 120 may be formed in a top surface S2 of the dielectric window 100. The magnetic-field control groove 120 may be formed in a portion of the top surface S2 of the dielectric window 100 in which interference between magnetic fields generated by the inner coil 410a and the outer coil 420a occurs. For example, the magnetic-field control groove 120 may be formed in the portion of the top surface S2 of the dielectric window 100 that corresponds to a space between the inner coil 410a and the outer coil 420a.

Referring to FIG. 17, the plasma process system 1000b according to the present example embodiment may differ from the plasma process system 1000 of FIG. 14 in terms of structures of a dielectric window 100f and a coil antenna 400b. In the plasma process system 1000b according to the present example embodiment, the dielectric window 100f may have a truncated conic structure, which is convex upward, instead of a flat structure. For example, the dielectric window 100f may have a truncated conic structure including inclined side surfaces and a flat top surface. However, the dielectric window 100f may have a lid-type structure of which the inside is vacant, slightly deviating from a truncated conic structure of which the inside is not vacant, and a side surface and a top surface of the dielectric window 100f may have the same thickness. Accordingly, a structure of the dielectric window 100f may correspond to a dome structure.

An arrangement structure of the coil antenna 400b may depend on a structure of the dielectric window 100f having the truncated conic structure. The coil antenna 400b may include an inner coil 410b and an outer coil 420b. The inner coil 410b may be located over a top surface of the dielectric window 100f, while the outer coil 420b may be located over a side surface of the dielectric window 100f. Further, the inner coil 410b located over the top surface of the dielectric window 100f may have a planar spiral structure. The outer coil 420b at least partially surrounding the side surface of the dielectric window 100f may have a 3D spring structure that extends and narrows upward.

A magnetic-field control groove 120e may be formed in a portion of the dielectric window 100f in which interference between magnetic fields generated by the inner coil 410b and the outer coil 420b occur. For example, as shown in FIG. 17, the magnetic-field control groove 120e may be formed in a portion of the dielectric window 100f in which a top surface of the dielectric window 100f meets a side surface thereof. A position or shape of the magnetic-field control groove 120e is not limited thereto. For example, as described with reference to FIGS. 4 to 9, the magnetic-field control groove 120e may be formed to have an appropriate shape in an appropriate position by analyzing a distribution of magnetic fields or a distribution of plasma densities in a chamber 500a.

Referring to FIG. 18, the plasma process system 1000c according to the present example embodiment may differ from the plasma process system 1000 of FIG. 14 in terms of structures of a dielectric window 100g and a coil antenna 400c. In the plasma process system 1000c according to the present example embodiment, the dielectric window 100g may have a dome structure that protrudes upward. For example, the dielectric window 100g may have a structure (e.g., a hemispheric structure) with a curved outer surface. Further, the dielectric window 100g may have a vacant internal structure and a uniform thickness. In the plasma process system 1000c according to the present example embodiment, a structure of the dielectric window 100g may correspond to a dome structure.

An arrangement of the coil antenna 400c may vary depending on the dome structure of the dielectric window 100g. The coil antenna 400c also may have an inner coil 410c and an outer coil 420c. The inner coil 410c may be located over an upper portion of the dielectric window 100g and the outer coil 420c may be located over a lower portion of the dielectric window 100g. Because both the inner coil 410c and the outer coil 420c at least partially surround an outer surface of the dielectric window 100g, each of the inner coil 410c and the outer coil 420c may have a spring structure that extends and narrows upward. That is, both the inner coil 410c and the outer coil 420c may have 3D spring structures.

A magnetic-field control groove 120f may be formed in a portion of the dielectric window 100g in which interference between magnetic fields generated by the inner coil 410c and the outer coil 420c occur. For example, as shown in FIG. 18, the magnetic-field control groove 120f may be formed in an outer surface of the dielectric window 100f that corresponds to a space between the inner coil 410c and the outer coil 420c. A position or shape of the magnetic-field control groove 120f is not limited thereto. For example, the magnetic-field control groove 120f may be formed in various positions and various shapes so that a distribution of magnetic fields or a distribution of plasma densities may be uniformized in the chamber 500a.

Figure 19:
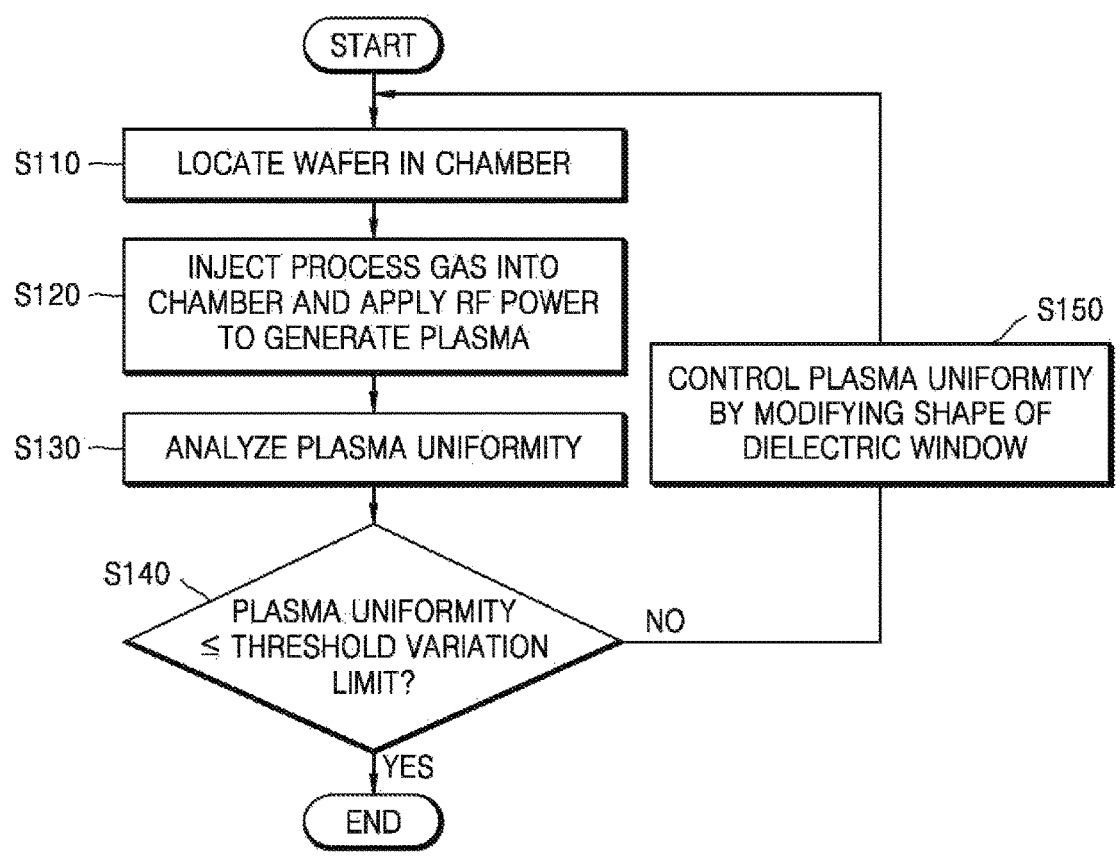
FIG. 19 is a flowchart of a process of analyzing and controlling plasma uniformity according to an example embodiment.

FIG. 19 is a flowchart of a process of analyzing and controlling plasma uniformity according to an example embodiment. The flowchart of FIG. 19 will be described with reference to FIG. 14 for brevity. The same descriptions as in FIGS. 1 to 18 will be simplified or omitted.

Referring to FIG. 19, a wafer 2000 may be located on an ESC 300 in a chamber 500 (S110). The chamber 500 may be the chamber 500 described in the plasma process system 100 of FIG. 14. Thus, a magnetic-field control groove 120 may be formed in a dielectric window 100 located on an outer wall 200. The magnetic-field control groove 120 may be formed in a top surface S2 of the dielectric window 100. A position or size of the magnetic-field control groove 120 may be determined in consideration of a plasma process. The plasma process system is not limited to the plasma process system 1000 of FIG. 14, but may be one of the plasma process systems 1000a, 1000b, and 1000c of FIGS. 16 to 18. The dielectric window 100 may not be the dielectric window 100 of FIG. 1A, but may be one of the dielectric windows 100a to 100e of FIGS. 11 to 13.

For example, RF power applied to a coil antenna 400 may be determined in consideration of plasma density required by a plasma process. To improve the uniformity of a distribution of magnetic fields or plasma densities, a position or a size of the magnetic-field control groove 120 may be determined based on the analyses shown in FIGS. 4 to 9. In some cases, the uniformity of a distribution of RF powers and magnetic fields may also be analyzed to determine the position or size of the magnetic-field control groove 120.

As described above, after the chamber 500 is formed by combining the dielectric window 100 in which the magnetic-field control groove 120 having an appropriate configuration is formed, with an upper portion of an outer wall of the chamber 500, a wafer that is desired to be processed by a plasma process may be located in the chamber 500. In some cases, the wafer may be a dummy wafer for calculating a magnetic field magnitude or plasma density in the chamber 500. That is, after plasma density in the chamber 500 and plasma uniformity based on the plasma density are confirmed by using the dummy wafer, a normal device wafer may be loaded into the chamber 500 and a plasma process may be performed.

Next, process gases may be injected into the chamber 500, and RF power may be applied into the chamber 500 so that plasma may be generated (S120). For example, the process gases may be transmitted from gas sources, sprayed via gas inlets through process gas supply heads, and injected into the chamber 500. The RF power may be applied to the coil antenna 400 through an upper RF power device 600. Furthermore, the RF power may be applied to the wafer 2000 through a lower RF power device 700.

In this disclosure, generating plasma may include performing a plasma process on the wafer 2000 by using generated plasma. The plasma process may be, for example, an etching process, a deposition process, a diffusion process, or a surface processing process on the wafer 2000. In some cases, plasma may be used for a light source or in a new material synthesis process.

For reference, plasma may be divided into non-thermal plasma (or low temperature plasma) and thermal plasma depending on a temperature. The non-thermal plasma may be mainly used in semiconductor processes, such as a semiconductor fabrication process, metal/ceramic thin film fabrication processes, and a material synthesis process. The thermal plasma may be applied to a metal cutting process. The non-thermal plasma may be subdivided into atmospheric plasma, vacuum plasma, and advanced plasma depending on an application field. An atmospheric plasma technique may refer to a technique of generating non-thermal plasma while maintaining gases under a pressure of about 100 Torr to an atmospheric pressure of about 760 Torr. The atmospheric plasma technique may be used for a surface modification process, a display plate cleaning process, and a light source for a liquid crystal display (LCD). A vacuum plasma technique may refer to a technique of generating non-thermal plasma while maintaining gases under a pressure of about 100 Torr or lower. The vacuum plasma technique may be used in semiconductor processes, for example, a dry etching process, a thin film deposition process, a photoresist (PR) ashing process, and an atomic layer deposition (ALD) process. The vacuum plasma technique may be used in display processes, for example, an etching process or a thin film deposition process for a display plate. An advanced plasma technique may refer to a technique of generating new concept non-thermal plasma and/or generating non-thermal plasma applicable to new advanced technology.

Plasma may be classified into capacitively coupled plasma (CCP), inductively coupled plasma (ICP), electron cyclotron resonance (ECR), surface wave plasma (SWP), helicon-wave plasma, and electron-beam (e-beam) plasma depending on how to generate plasma. The plasma process systems according to the present example embodiments may correspond to an ICP process system, and generated plasma may be ICP. In the ICP process system, a magnetic field generated by a coil antenna may greatly contribute to generating plasma. As described above, a distribution of magnetic fields may greatly affect a distribution of plasma densities. In methods of controlling plasma uniformity according to some example embodiments of the present inventive concepts, a plasma process may be performed by using the chamber 500 adopting the dielectric window 100 shown in FIG. 1A. Thus, the uniformity of a distribution of magnetic fields in the chamber 500 and the uniformity of plasma in the chamber 500 may be improved so that a stable plasma process may be performed.

Thereafter, plasma uniformity may be analyzed (S130). The analysis of plasma uniformity may be performed during or after the plasma process. An analysis system may analyze the plasma uniformity by using an analysis program. For example, the analysis of plasma uniformity may include detecting plasma in the chamber 500 by using a probe or OES system combined with a view-port of the chamber 500 and analyzing, by the analysis system, plasma density and uniformity based on detected plasma data using the analysis program.

Further, the analysis of plasma uniformity may be performed by measuring data regarding the wafer 2000 after the plasma process. For example, when an etching process or a deposition process is performed by using plasma, an etch state or deposition state of the wafer 2000 may be measured. By using the analysis program, an analysis system may calculate plasma density in the chamber 500 based on the measured data and analyze plasma uniformity.

Meanwhile, the analysis system may generally analyze a plasma state in addition to the plasma uniformity. For example, the analysis system may ascertain whether plasma density is lower or higher than a reference plasma density.

After the plasma uniformity is analyzed, it may be determined whether or not the plasma has uniformity equal to or less than a threshold variation (S140). The analysis system may determine whether or not the plasma has uniformity equal to or less than a threshold variation. For example, the analysis system may prepare reference data regarding a distribution of plasma densities in a plasma process, compare the reference data with the analyzed distribution of plasma densities, and determine whether or not the plasma has uniformity equal to or less than a threshold variation. Furthermore, when the plasma state itself includes an error, the analysis system may detect the cause of the error and present new process conditions for the plasma process.

If the plasma has uniformity equal to or less than a threshold variation (Yes), the method of controlling the plasma uniformity may be ended. If the plasma has uniformity greater than a threshold variation (No), the plasma uniformity may be controlled by modifying a shape of the dielectric window 100 (S150). For example, a position, structure, or size of the magnetic-field control groove 120 of the dielectric window 100 may be modified, the previous dielectric window may be replaced by a new dielectric window 100 including the modified magnetic-field control groove 120, and the new dielectric window 100 may be combined with the chamber 500 so that the plasma uniformity may be controlled. Meanwhile, the position, structure, or size of the magnetic-field control groove 120 may be modified based on the distribution of magnetic fields analyzed by the analysis system and the plasma uniformity affected by the distribution of magnetic fields. After the plasma uniformity is controlled, the process may return to the operation S110 of locating a wafer in the chamber 500, and the plasma process and the analysis of plasma uniformity may be performed.

Further, when the plasma state itself includes an error, other process parameters of the plasma process may be adjusted in the operation (S150) of controlling plasma uniformity. For example, RF power or the injected amounts of process gases may be adjusted.

Meanwhile, when the plasma has uniformity equal to or less than a threshold variation, an additional process of measuring data regarding the wafer may be omitted. For example, when the measured plasma has uniformity less than a threshold variation, a process of measuring data regarding the wafer may be performed. Process failures in a plasma process (e.g., a deposition process, an etching process, and a diffusion process) performed on the wafer may be confirmed via the measuring process. The process of measuring the data regarding the wafer may be an operation of ascertaining whether or not plasma uniformity is normal. When the plasma uniformity is determined as normal, an additional process of measuring the data regarding the wafer may not be performed.

The methods of controlling plasma uniformity according to some example embodiments of the present inventive concepts may include performing a plasma process by using the chamber 500 adopting the dielectric window 100 having the magnetic-field control groove 120. By controlling the plasma uniformity, plasma uniformity may be controlled further precisely in the plasma process. In the related art, a chamber, which adopts a dielectric window without a magnetic-field control groove therein, may be limited to improve plasma uniformity in a chamber because there is a dead zone in the chamber and it is difficult to control a magnetic field magnitude in the dead zone. In contrast, a chamber adopting a dielectric window according to some example embodiments of the present inventive concepts may adjust a magnetic field magnitude in a dead zone by using a magnetic-field control groove. Accordingly, the chamber adopting the dielectric window according to some example embodiments of the present inventive concepts may solve drawbacks of the chamber of the related art and improve plasma uniformity. The method of controlling plasma uniformity according to the present example embodiment may enable a stable plasma process and thus fabricating a more reliable semiconductor device.

Figure 20:
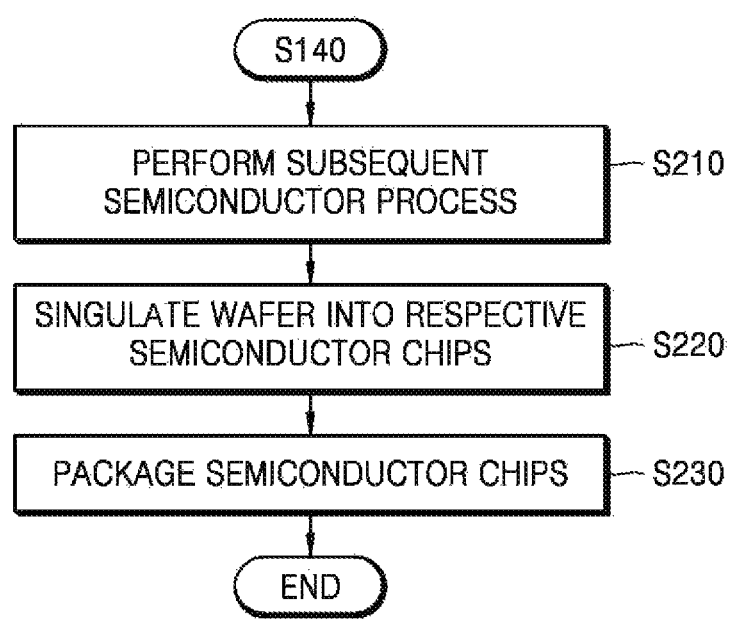
FIG. 20 is a flowchart of a method of manufacturing a semiconductor device by using the method of controlling plasma as shown in FIG. 19, according to an example embodiment.

FIG. 20 is a flowchart of a method of manufacturing a semiconductor device by using the method of controlling plasma as shown in FIG. 19, according to an example embodiment. The same descriptions as in FIG. 19 will be simplified or omitted.

Before performing the method illustrated in FIG. 20, a method of controlling plasma uniformity may be performed as described with reference to FIG. 19. The method of controlling the plasma uniformity may include performing a plasma process on a wafer 2000. For example, the operation S120 of generating plasma as described with reference to FIG. 19 may correspond to performing the plasma process on the wafer 2000.

An arrow from the operation "S140" may refer to ending the method of controlling plasma uniformity and entering into the next operation. For example, in the operation S140 of determining whether or not plasma has uniformity equal to or less than a threshold variation as described with reference to FIG. 19, the plasma may be determined to have uniformity equal to or less than a threshold variation (Yes). Then, the method of controlling plasma uniformity may be ended, and the process may enter into the next operation. For example, the method of controlling plasma uniformity may be a method of controlling plasma uniformity for a normal device wafer. In a method of controlling plasma uniformity for a dummy wafer to calculate a plasma density or a magnetic field magnitude, even though plasma has uniformity equal to or less than a threshold variation, the process may return to the operation S110 to locate a normal wafer in the chamber, and a method of controlling plasma uniformity (e.g., S130, S140 and S150) for the normal device wafer may be performed. Thereafter, the next operation may be performed. In some cases, because the plasma uniformity has been already confirmed, the operation S120 of generating plasma may be performed on the normal device wafer, and the process may enter into the next operation without performing the steps (e.g., S130, S140 and S150) relating to controlling plasma uniformity.

A subsequent semiconductor process may be performed on the wafer 2000 (S210). The subsequent semiconductor process on the wafer 2000 may include various processes. For example, the subsequent semiconductor process on the wafer 2000 may include a deposition process, an etching process, an ion process, and a cleaning process. The deposition process, the etching process, the ion process, and the cleaning process may be processes using plasma or plasma-free processes. If the subsequent semiconductor process on the wafer 2000 is a process using plasma, the above-described method of controlling plasma uniformity may be applied again. By performing the subsequent semiconductor process on the wafer 2000, integrated circuits (ICs) and interconnections desired for a semiconductor device may be formed. Meanwhile, the subsequent semiconductor process on the wafer 2000 may include a process of testing a wafer-level semiconductor device.

The wafer 2000 may be singulated into respective semiconductor chips (S220). The singulation of the wafer 2000 into the respective semiconductor chips may be performed by means of a sawing process using a blade or a laser.

Thereafter, a packaging process may be performed on the semiconductor chips (S230). The packaging process may refer to a process of mounting the semiconductor chips on a printed circuit board (PCB) and encapsulating the semiconductor chips by using an encapsulant. Meanwhile, the packaging process may include forming a stack package by stacking a plurality of semiconductor chips on the PCB or forming a package-on-package (PoP) structure by stacking a package on a package. By performing the packaging process on the semiconductor chips, fabrication of a semiconductor device or a semiconductor package may be completed. After the packaging process is performed, a test process may be performed on the semiconductor package.

In the methods of manufacturing the semiconductor device according to some example embodiments of the present inventive concepts, plasma uniformity may be controlled by using the plasma process systems 1000, 1000a, 1000b, and 1000c of FIGS. 14 to 18. That is, plasma uniformity in the chamber 500 may be improved, and thus the plasma process in the chamber 500 may be improved by using a plasma process system including the chamber 500, which adopts the dielectric window 100 having the magnetic-field control groove 120 formed thereon. Thus, more reliable semiconductor devices may be fabricated.

While the inventive concepts have been particularly shown and described with reference to example embodiments thereof, it will be understood that various changes in form and details may be made therein without departing from the spirit and scope of the following claims.

What is claimed is:

1. A dielectric window comprising a first dielectric material, the dielectric window including a first surface facing an inside of a plasma chamber and a second surface opposite to the first surface and facing an outside of the plasma chamber, the dielectric window defining a groove in the second surface thereof, the groove configured to control magnetic fields in the plasma chamber, wherein a position of the groove is determined such that interference between magnetic fields respectively generated by an inner coil and an outer coil located over the second surface of the dielectric window is inhibited, and a depth of the groove is determined so as to uniformize magnitudes of the magnetic fields.

2. The dielectric window of claim 1, wherein a bottom surface of the groove is exposed, and a depth of the groove is smaller than a thickness of the dielectric window at a portion where the groove is not defined.

3. The dielectric window of claim 1, wherein the dielectric window has a uniform thickness, and the groove is filled with (1) a second dielectric material having a lower dielectric constant than the first dielectric material or (2) a filling material having a higher magnetic permeability than the first dielectric material.

4. The dielectric window of claim 1, wherein the dielectric window has one of a circular plate structure and a dome structure, and the groove is ring shaped.

5. A plasma process system comprising:
a chamber including an outer wall and a dielectric window, the outer wall defining a reaction space in which plasma is generated, the dielectric window covering an upper portion of the outer wall and including a first dielectric material, the dielectric window defining a groove in an outer surface of the dielectric window, the outer surface being a surface opposite to an inner surface facing the reaction space, the groove configured to control magnetic fields in the chamber;
a coil antenna over the outer surface of the dielectric window, the coil antenna including an inner coil and an outer coil; and
a radio-frequency (RF) power device configured to supply RF power to the coil antenna,
wherein the groove is provided in a portion of the outer surface of the dielectric window that corresponds to a dead zone, the dead zone being a zone in the chamber at which the magnetic fields weaken due to interference between a magnetic field generated by the inner coil and a magnetic field generated by the outer coil.

6. The system of claim 5, wherein (1) a bottom surface of the groove is exposed, (2) the groove is filled with a second dielectric material having a lower dielectric constant than the first dielectric material, or (3) the groove is filled with a filling material having a higher magnetic permeability than the first dielectric material.

7. The system of claim 5, wherein the inner coil is over a center of the dielectric window,
the outer coil is over an edge of the dielectric window and at least partially surrounds the inner coil, and
the groove is ring-shaped and is in a portion of the outer surface of the dielectric window that corresponds to a space between the inner coil and the outer coil.

8. The system of claim 7, wherein the dielectric window has a circular plate structure, and
the inner coil and the outer coil have spiral shapes on a same plane surface, or cylindrical shapes in which the inner coil and the outer coil extend upward.

9. The system of claim 7, wherein the dielectric window has a dome structure, and
the inner coil and the outer coil at least partially surround an outer surface of the dome structure.

10. The system of claim 5, wherein a position of the groove is determined such that the interference is inhibited, and
a depth of the groove is determined so as to uniformize magnitudes of the magnetic fields in the chamber.

11. The system of claim 5, wherein the groove is ring shaped, and
at least one of a position of the groove and a parameter of the groove is configured to cause plasma provided in the chamber to have uniformity equal to or less than a threshold variation,
wherein the parameter is at least one of an inside diameter, an outside diameter, and a depth.

12. The system of claim 5, wherein the dielectric window has a circular plate structure, and
the groove is ring shaped from a top view, and
the groove is rectangular from a side view.

13. A plasma process apparatus comprising:
a process chamber defined by an outer wall and a dielectric window, the dielectric window including a first dielectric material and covering an upper portion of the outer wall, the dielectric window including a top surface facing outside the process chamber and a bottom surface facing inside the process chamber, the dielectric window defining at least one groove at the top surface of the dielectric window, the groove configured to control a magnetic field in the process chamber; and
a coil antenna over the dielectric window and configured to receive RF power, the coil antenna including an inner coil and an outer coil, the inner coil over a center of the dielectric window, the outer coil over an edge of the dielectric window and at least partially surrounding the inner coil,
wherein the groove is defined in a portion of the top surface of the dielectric window that corresponds to a space between the inner coil and the outer coil.

14. The plasma process apparatus of claim 13, wherein the groove is configured to have at least one of a position and a shape such that a uniformity of the plasma is equal to or less than a threshold uniformity variation.

15. The plasma process apparatus of claim 14, wherein the shape includes at least one of an inside diameter, an outside diameter, and a depth.

16. The plasma process apparatus of claim 13, wherein the groove is defined in a portion of the top surface of the dielectric window that corresponds to a dead zone, the dead zone being a zone in the process chamber at which the magnetic field weakens due to interference between a magnetic field generated by the inner coil and a magnetic field generated by the outer coil.

* * * * *